United States Patent
Richardson

(10) Patent No.: US 11,411,581 B2
(45) Date of Patent: *Aug. 9, 2022

(54) ROW ORTHOGONALITY IN LDPC RATE COMPATIBLE DESIGN

(71) Applicant: QUALCOMM Incorporated, San Diego, CA (US)

(72) Inventor: Thomas Richardson, South Orange, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/867,330

(22) Filed: May 5, 2020

(65) Prior Publication Data
US 2020/0266832 A1 Aug. 20, 2020

Related U.S. Application Data

(63) Continuation of application No. 15/975,440, filed on May 9, 2018, now Pat. No. 10,680,646.
(Continued)

(51) Int. Cl.
*H03M 13/11* (2006.01)
*H03M 13/00* (2006.01)
(Continued)

(52) U.S. Cl.
CPC ...... *H03M 13/1111* (2013.01); *H03M 13/114* (2013.01); *H03M 13/116* (2013.01);
(Continued)

(58) Field of Classification Search
CPC ............ H03M 13/1111; H03M 13/114; H03M 13/116; H03M 13/616; H03M 13/618;
(Continued)

(56) References Cited

U.S. PATENT DOCUMENTS 6,633,865 B1  10/2003  Liao
6,961,888 B2  11/2005  Jin et al.
(Continued)

FOREIGN PATENT DOCUMENTS

EP  2091171 A2  8/2009
EP  3264611 A1  1/2018
(Continued)

OTHER PUBLICATIONS

Taiwan Search Report—TW107115891—TIPO—dated Sep. 16, 2020.
(Continued)

*Primary Examiner* — Shelly A Chase
(74) *Attorney, Agent, or Firm* — Patterson + Sheridan LLP

(57) ABSTRACT

Certain aspects of the present disclosure generally relate to methods and apparatus for decoding low-density parity check (LDPC) codes, for example, using a parity check matrix having full row-orthogonality. An exemplary method for performing low-density parity-check (LDPC) decoding includes receiving soft bits associated to an LDPC codeword and performing LDPC decoding of the soft bits using a parity check matrix, wherein each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected.

20 Claims, 30 Drawing Sheets

Related U.S. Application Data

(60) Provisional application No. 62/505,573, filed on May 12, 2017.

(51) Int. Cl.
  *H04L 1/00* (2006.01)
  *H04L 1/18* (2006.01)

(52) U.S. Cl.
  CPC .... *H03M 13/1137* (2013.01); *H03M 13/1185* (2013.01); *H03M 13/616* (2013.01); *H03M 13/618* (2013.01); *H03M 13/6306* (2013.01); *H03M 13/6393* (2013.01); *H03M 13/6561* (2013.01); *H04L 1/00* (2013.01); *H04L 1/0057* (2013.01); *H04L 1/0069* (2013.01); *H04L 1/1812* (2013.01)

(58) Field of Classification Search
  CPC ......... H03M 13/6561; H03M 13/6306; H03M 13/6393; H03M 13/1137; H03M 13/1185; H04L 1/00; H04L 1/0057; H04L 1/0069; H04L 1/1812
  See application file for complete search history.

(56) References Cited

U.S. PATENT DOCUMENTS

| | | | |
|---|---|---|---|
| 7,133,853 B2 | 11/2006 | Richardson et al. | |
| 7,552,097 B2 | 6/2009 | Richardson et al. | |
| 7,627,801 B2 | 12/2009 | Jin et al. | |
| 8,504,887 B1* | 8/2013 | Varnica | H03M 13/373 |
| | | | 714/790 |
| 8,751,902 B2 | 6/2014 | Jin et al. | |
| 2007/0220399 A1 | 9/2007 | Kim et al. | |
| 2007/0245217 A1 | 10/2007 | Valle | |
| 2014/0229788 A1 | 8/2014 | Richardson | |
| 2016/0211941 A1* | 7/2016 | Shen | H04L 1/0041 |
| 2016/0261371 A1 | 9/2016 | Klenner et al. | |
| 2017/0033914 A1 | 2/2017 | Park et al. | |
| 2017/0250712 A1 | 8/2017 | Chiu et al. | |
| 2019/0013827 A1 | 1/2019 | Richardson et al. | |
| 2019/0140061 A1 | 5/2019 | Chu-Kung et al. | |
| 2019/0334559 A1* | 10/2019 | Panteleev | H03M 13/1137 |
| 2020/0395957 A1* | 12/2020 | Shin | H03M 13/616 |

FOREIGN PATENT DOCUMENTS

| | | |
|---|---|---|
| KR | 20070080407 A | 8/2007 |
| KR | 20090091768 A | 8/2009 |
| WO | 2014127129 A1 | 8/2014 |
| WO | WO-2018128560 A1 | 7/2018 |

OTHER PUBLICATIONS

Ericsson: "Design Parameters and Implementation Aspects of LPDC Codes," 3GPP Draft; R1-1703537 Design Parameters and Implementation Aspects of LDPC Codes, 3rd Generation Partnership Project (3GPP), Mobile Competence Centre; 650, Route Des Lucioles; F-06921 Sophia-Antipolis, vol. RAN WG1, No. Athens, Greece; Feb. 13, 2017-Feb. 17, 2017, Feb. 15, 2017, XP051222070, 10 pages, Retrieved from the Internet: URL: http://www.3gpp.org/ftp/tsg_ran/WG1_RL1/TSGR1_88/Docs/ [retrieved on Feb. 15, 2017].

Huawei, et al., "LDPC Design for eMBB Data," 3GPP Draft; R1-1704250 LDPC Design for eMBB Data, 3rd Generation Partnership Project (3GPP), Mobile Competence Centre; 650, Route Des Lucioles; F-06921, Sophia-Antipolis Cedex; France, vol. RAN WG1, No. Spokane, USA; Apr. 3, 2017-Apr. 7, 2017, Apr. 2, 2017, XP051242402, 6 pages, Retrieved from the Internet: URL: http://www.3gpp.org/ftp/Meetings_3GPP_SYNC/RAN1/Docs/ [retrieved on Apr. 2, 2017].

International Search Report and Written Opinion—PCT/US2018/031988—ISA/EPO—dated Aug. 20, 2018.

Mackay D.J.C., "Good Error-Correcting Codes Based on Very Sparse Matrices," IEEE Transactions on Information Theory, Mar. 1999, vol. 45 (2), pp. 399-431.

Mitchell D.G.M., et al., "Randomly Punctured Spatially Coupled LDPC Codes", IEEE, pp. 1-6, 2014.

Richardson T., et al., "Design of Low-Density Parity Check Codes for 5G New Radio," IEEE Communications Magazine, vol. 56 (3), Mar. 1, 2018, pp. 28-34, XP055480192.

Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.

Tarik et al., "Protograph Based LDPC Convolutional Codes for Continuous Phase Modulation", IEEE, 9 Pages, (Year: 2015), pp. 4454-4460.

Vahabzadeh O., et al., "Cooperative Communication Using Protograph-Based Low Density Parity Check Codes", IEEE, 4 Pages, 2013.

Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.

Nokia, et al., "LDPC Design for eMBB Data", 3GPP Draft, 3GPP TSG-RAN WG1#NR Ad-Hoc meeting, R1-1701028_LDPC Design for EMBB, 3rd Generation Partnership Project (3GPP), Mobile Competence Centre; 650, Route Des Lucioles; F-06921 Sophia-Antipolis Cedex; France, vol. Ran WG1, No. Spokane, U.S.A., Jan. 16, 2017-Jan. 20, 2017, Jan. 16, 2017 (Jan. 16, 2017), 13 Pages, XP051208543, Retrieved from the Internet: URL: http://www.3gpp.org/ftp/Meetings_3GPP_SYNC/RAN1/Docs/ [retrieved on Jan. 16, 2017], the whole document.

Nokia, et al., "R1-1701028_PCM_Large_Blocks," Jan. 9, 2017 (Jan. 9, 2017), pp. 1-1, XP055847852, Retrieved from the Internet: URL: https://www.3gpp.org/ftp/tsg_ran/WG1_RL1/TSGR1_AH/NR_AH_1701/Docs/[retrieved on Oct. 5, 2021].

\* cited by examiner

FIG. 10

| Parity Check Rows | Bit Columns | | | | | | | | | | | | | | | | | | | | | | | |
|---|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
| 0 | 48 | 29 | 28 | 39 | 9 | 61 | - | - | - | 63 | 45 | 80 | - | - | - | 37 | 32 | 22 | 1 | 0 | - | - | - | - |
| 1 | 4 | 49 | 42 | 48 | 11 | 30 | - | - | - | 49 | 17 | 41 | 37 | - | - | 54 | - | - | - | 0 | 0 | - | - | - |
| 2 | 35 | 76 | 78 | 51 | 37 | 35 | 21 | - | 17 | 64 | - | - | - | 15 | 7 | - | - | 32 | - | - | 0 | 0 | - | - |
| 3 (1002) | 9 | 65 | 44 | 9 | 54 | 56 | 73 | 34 | 42 | - | - | - | 35 | 59 | - | - | 46 | 39 | 0 | - | - | 0 | 0 | - |
| 4 (1006) | 3 | 62 | 7 | 80 | 68 | 26 | - | 80 | 55 | - | 36 | - | 26 | - | 9 | - | 72 | - | - | - | - | - | 0 | 0 |
| 5 (1008) | 26 | 75 | 33 | 21 | 69 | 59 | 3 | 38 | - | - | - | 35 | - | 62 | 36 | 26 | - | - | 1 | - | - | - | - | 0 |

(1000, columns 1010, 1012 indicate bit columns 5 and 6; 1014, 1020, 1022 indicate entries in row positions near 26/59)

FIG. 12A

| | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| 1202 → | 1 | 1 | 1 | 1 | 1 | 1 | 1 | 1 | 1 | 1 | 1 | 1 | 1 | 1 | 1 | 1 | 1 | 1 |
| 1204 → | 0 | 1 | 1 | 1 | 1 | 1 | 1 | 1 | 1 | 1 | 1 | 1 | 1 | 1 | 1 | 1 | 1 | 1 |
| 1206 → | 0 | 0 | 1 | 1 | 1 | 1 | 1 | 1 | 1 | 1 | 1 | 1 | 1 | 1 | 1 | 1 | 1 | 1 |
| 1220 → | 4 | 13 | 13 | 4 | 5 | 4 | 13 | 4 | 10 | 2 | 0 | 9 | 13 | · | 5 | 12 | · | · |
| | 9 | 10 | · | 3 | 9 | 14 | 2 | 7 | 7 | 8 | 7 | 3 | 15 | 3 | · | · | 3 | 2 |
| | 3 | 5 | · | 13 | · | · | · | · | · | · | · | 14 | 5 | 6 | 3 | 0 | 8 | 7 |
| | 13 | 2 | 9 | · | 6 | 7 | 13 | 14 | 9 | 4 | 6 | · | · | 10 | 0 | 5 | 9 | 0 |
| | 1 | 1 | · | · | · | · | · | · | · | · | · | · | · | · | · | · | · | · |
| | 11 | 13 | 2 | 14 | · | · | · | · | · | 1 | 6 | · | · | 12 | 7 | · | 13 | · |
| | 6 | 2 | · | · | 11 | · | 13 | 0 | 5 | 12 | 9 | · | 9 | · | · | · | · | · |
| | 11 | 3 | · | · | · | 8 | · | · | 3 | 7 | 1 | · | · | · | 8 | · | 10 | 8 |
| | · | 2 | · | · | · | · | · | · | · | · | · | · | · | · | 15 | · | · | · |
| | 3 | 6 | · | · | · | · | 7 | 4 | 8 | · | · | · | 14 | · | · | 9 | · | · |
| | 2 | 11 | · | 15 | · | · | · | · | · | · | 5 | 7 | · | · | · | · | · | 4 |
| | · | · | · | · | · | · | · | · | · | · | · | · | · | · | · | · | · | · |
| | 13 | 0 | 7 | · | · | 10 | 6 | 15 | · | 10 | 7 | 8 | 8 | 0 | 13 | 9 | 14 | · |
| | · | · | · | · | · | · | · | · | 6 | 14 | · | · | · | 6 | · | · | · | · |
| | 8 | 13 | 7 | · | · | · | 1 | · | · | · | · | · | 0 | 0 | · | 7 | · | 4 |
| 1210 → 9 | 1212 → 3 | · | · | · | · | · | · | · | · | · | · | · | · | · | · | · | · |

FIG. 13A

|    | 20 | 21 | 22 | 23 | 24 | 25 | 26 | 27 | 28 | 29 | 30 | 31 | 32 | 33 | 34 | 35 | 36 | 37 | 38 |
|----|----|----|----|----|----|----|----|----|----|----|----|----|----|----|----|----|----|----|----|
|    | 1  | 1  | 1  | 0  | 0  | 0  | 0  | 0  | 0  | 0  | 0  | 0  | 0  | 0  | 0  | 0  | 0  | 0  | 0  |
|    | 1  | 1  | 1  | 1  | 1  | 1  | 1  | 1  | 1  | 1  | 1  | 1  | 1  | 1  | 1  | 1  | 1  | 1  | 1  |
| 27 |    | 5  | 9  |    | o  | o  |    |    |    |    |    |    |    |    |    |    |    |    |    |
| 18 |    | 10 | 13 |    | 30 | o  | o  |    |    |    |    |    |    |    |    |    |    |    |    |
| 7  |    | 0  | 31 |    | 14 |    | o  | o  |    |    |    |    |    |    |    |    |    |    |    |
|    |    |    |    | 0  |    |    |    |    |    |    |    |    |    |    |    |    |    |    |    |
|    |    |    |    | 9  | 26 |    |    |    | o  |    |    |    |    |    |    |    |    |    |    |
| 16 |    | 0  |    | 13 |    |    |    |    |    | o  |    |    |    |    |    |    |    |    |    |
|    |    |    |    | 17 |    |    |    |    |    |    | o  |    |    |    |    |    |    |    |    |
|    |    | 5  |    |    | 7  | 4  |    |    |    |    |    | o  |    |    |    |    |    |    |    |
| 19 |    |    |    |    |    |    |    |    |    |    |    |    | o  |    |    |    |    |    |    |
|    |    |    |    |    | 25 |    |    |    | 28 |    |    |    |    | o  |    |    |    |    |    |
| 23 |    |    |    |    |    |    |    |    |    |    |    |    |    |    | o  |    |    |    |    |
|    |    |    |    |    | 15 |    |    |    |    |    |    |    |    |    |    | o  |    |    |    |
|    |    |    |    |    |    |    |    |    |    |    |    |    |    |    |    |    | o  |    |    |
|    |    |    |    |  ← 1314 |    |    |    |    |    |    |    |    |    |    |    |    |    | o  |    |

ROW ORTHOGONALITY IN LDPC RATE COMPATIBLE DESIGN

CROSS-REFERENCE TO RELATED APPLICATIONS

The present Application is a continuation of U.S. application Ser. No. 15/975,440, filed May 9, 2018, which claims priority to U.S. Provisional Application No. 62/505,573, filed May 12, 2017, both of which are assigned to the assignee hereof and hereby expressly incorporated by reference herein in their entirety.

TECHNICAL FIELD

Certain aspects of the present disclosure generally relate to methods and apparatus for wireless communications, and more particularly to row orthogonality in a low-density parity check (LDPC) rate compatible design.

INTRODUCTION

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include Long Term Evolution (LTE) systems, Code Division Multiple Access (CDMA) systems, Time Division Multiple Access (TDMA) systems, Frequency Division Multiple Access (FDMA) systems, $3^{rd}$ Generation Partnership Project (3GPP) Long Term Evolution (LTE) systems, Long Term Evolution Advanced (LTE-A) systems, and Orthogonal Frequency Division Multiple Access (OFDMA) systems.

Generally, a wireless multiple-access communication system can simultaneously support communication for multiple wireless nodes. Each node communicates with one or more base stations via transmissions on forward and reverse links. The forward link (or downlink) refers to a communication link from base stations to nodes, and a reverse link (or uplink) refers to a communication link from nodes to base stations. Communication links may be established via a single-input single-output, multiple-input single-output, or a multiple-input multiple-output (MIMO) system.

In the modern information age, binary values (e.g., ones and zeros), are used to represent and communicate various types of information, such as video, audio, statistical information, etc. Unfortunately, during storage, transmission, and/or processing of binary data, errors may be unintentionally introduced; for example, a one may be changed to a zero or vice versa.

Generally, in the case of data transmission, a receiver observes each received bit in the presence of noise or distortion and only an indication of the bit's value is obtained. Under these circumstances, the observed values are interpreted as a source of "soft" bits. A soft bit indicates a preferred estimate of the bit's value (e.g., a one or a zero) together with some indication of the reliability of that estimate. While the number of errors may be relatively low, even a small number of errors or level of distortion can result in the data being unusable or, in the case of transmission errors, may necessitate re-transmission of the data.

In order to provide a mechanism to check for errors and, in some cases, to correct errors, binary data can be coded to introduce carefully designed redundancy. Coding of a unit of data produces what is commonly referred to as a code word. Because of its redundancy, a code word will often include more bits than the input unit of data from which the code word was produced.

Redundant bits are added by an encoder to the transmitted bit stream to create a code word. When signals arising from transmitted code words are received or processed, the redundant information included in the code word as observed in the signal can be used to identify and/or correct errors in or remove distortion from the received signal in order to recover the original data unit. Such error checking and/or correcting can be implemented as part of a decoding process. In the absence of errors, or in the case of correctable errors or distortion, decoding can be used to recover from the source data being processed, the original data unit that was encoded. In the case of unrecoverable errors, the decoding process may produce some indication that the original data cannot be fully recovered. Such indications of decoding failure can be used to initiate retransmission of the data.

With the increased use of fiber optic lines for data communication and increases in the rate at which data can be read from and stored to data storage devices, (e.g., disk drives, tapes, etc.), there is an increasing need not only for efficient use of data storage and transmission capacity but also for the ability to encode and decode data at high rates of speed.

While encoding efficiency and high data rates are important, for an encoding and/or decoding system to be practical for use in a wide range of devices (e.g., consumer devices), it is important that the encoders and/or decoders be capable of being implemented at reasonable cost.

Communication systems often need to operate at several different rates. One way to keep the implementation as simple as possible and to provide for the coding and decoding at the different rates is to use adjustable low-density-parity check (LDPC) codes. In particular, one can generate higher-rate LDPC codes by puncturing lower-rate codes.

These multiple access technologies have been adopted in various telecommunication standards to provide a common protocol that enables different wireless devices to communicate on a municipal, national, regional, and even global level. An example of an emerging telecommunication standard is new radio (NR). NR is a set of enhancements to the LTE mobile standard (e.g., 5G radio access) promulgated by Third Generation Partnership Project (3GPP). NR is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL), as well as supporting beamforming, multiple-input multiple-output (MIMO) antenna technology, and carrier aggregation.

As the demand for mobile broadband access continues to increase, there exists a need for further improvements in NR technology. Preferably, these improvements should be applicable to other multi-access technologies and the telecommunication standards that employ these technologies. One area for improvements is the area of encoding/decoding, applicable to NR. For example, techniques for high performance LDPC codes for NR are desirable.

BRIEF SUMMARY

The systems, methods, and devices of the disclosure each have several aspects, no single one of which is solely responsible for its desirable attributes. Without limiting the scope of this disclosure as expressed by the claims, which follow, some features will now be discussed briefly. After considering this discussion, and particularly after reading the section entitled "Detailed Description" one will understand how the features of this disclosure provide advantages that include improved communications between access points and stations in a wireless network.

Certain aspects of the present disclosure provide a method for performing low-density parity-check (LDPC) decoding. The method generally includes receiving soft bits associated to an LDPC codeword and performing LDPC decoding of the soft bits using a parity check matrix, wherein each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected.

Certain aspects of the present disclosure provide an apparatus for performing low-density parity-check (LDPC) decoding. The apparatus generally includes a processor configured to cause the apparatus to receive soft bits associated to an LDPC codeword and to perform LDPC decoding of the soft bits using a parity check matrix, wherein each row of the parity check matrix corresponds to a lifted parity check of layered lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected. The apparatus also generally includes a memory coupled with the processor.

Certain aspects of the present disclosure provide an apparatus for performing low-density parity-check (LDPC) decoding. The apparatus generally includes means for receiving soft bits of an LDPC codeword and means for performing LDPC decoding of the soft bits using a parity check matrix, wherein each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected.

Certain aspects of the present disclosure provide a computer-readable medium for performing low-density parity-check (LDPC) decoding. The computer-readable medium generally includes instructions that, when executed by at least one processor, cause the at least one processor to receive soft bits associated to an LDPC codeword and perform LDPC decoding of the soft bits using a parity check matrix, wherein each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected.

Certain aspects of the present disclosure provide a method for performing low-density parity-check (LDPC) encoding. The method generally includes obtaining information bits of a codeword and performing encoding of the information bits to compute parity bits of an LDPC codeword according to a parity check matrix, wherein each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected.

Certain aspects of the present disclosure provide an apparatus for performing low-density parity-check (LDPC) encoding. The apparatus generally includes a processor configured to cause the apparatus to obtain information bits of a codeword and perform encoding of the information bits to compute parity bits of an LDPC codeword according to a parity check matrix, wherein each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected. The apparatus also generally includes a memory coupled with the processor.

Certain aspects of the present disclosure provide an apparatus for performing low-density parity-check (LDPC) decoding. The apparatus generally includes means for obtaining information bits of a codeword and means for performing encoding of the information bits to compute parity bits of an LDPC codeword according to a parity check matrix, wherein each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected.

Certain aspects of the present disclosure provide a computer-readable medium for performing low-density parity-check (LDPC) decoding. The computer-readable medium generally includes instructions that, when executed by at least one processor, cause the at least one processor to obtain information bits of a codeword and to perform encoding of the information bits to compute parity bits of an LDPC codeword according to a parity check matrix, wherein each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. The appended drawings illustrate only certain typical aspects of this disclosure, however, and are therefore not to be considered limiting of its scope, for the description may admit to other equally effective aspects.

FIG. 10 illustrates an example of this process for computing/updating bit LLRs and a posteriori LLRs in a parity check matrix, according to certain aspects of the present disclosure.

FIGS. 12 and 12A through 12H illustrate a parity check matrix with quasi-row orthogonality, according to certain aspects of the present disclosure.

FIGS. 13 and 13A through 13H illustrate a parity check matrix with full-row orthogonality, according to certain aspects of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
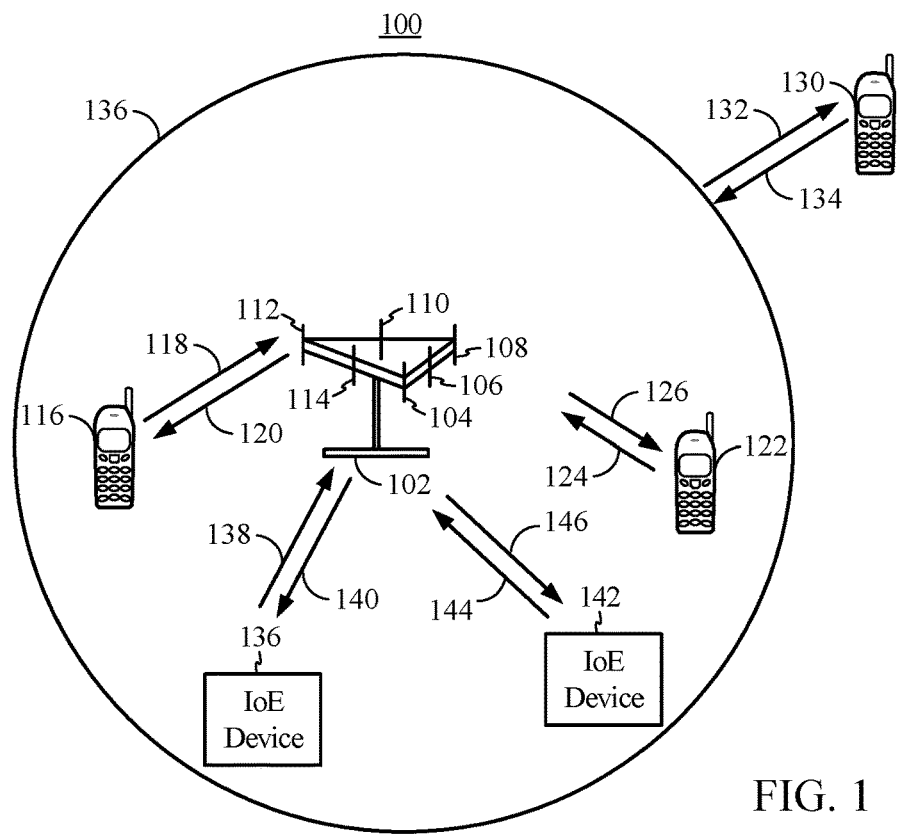
FIG. 1 illustrates an example multiple access wireless communication system, according to certain aspects of the present disclosure.

Aspects of the present disclosure provide apparatus, methods, processing systems, and computer program products for encoding for new radio (NR) (new radio access technology). New radio (NR) may refer to radios configured to operate according to a new air interface or fixed transport layer. NR may include Enhanced mobile broadband (eMBB) techniques targeting wide bandwidth (e.g. 80 MHz and wider) communications systems, millimeter wave (mmW) techniques targeting high carrier frequency (e.g. 27 GHz and higher) communications systems, massive machine type communications (mMTC) techniques targeting non-backward compatible machine type communications (MTC) systems, and mission critical techniques targeting ultra reliable low latency communications (URLLC). For these general topics, different techniques are considered, such as coding techniques, including low-density parity check (LDPC) coding, and polar coding. An NR cell may refer to a cell operating according to the new air interface or a fixed transport layer. An NR Node B (e.g., a 5G Node B) may correspond to one or multiple transmission reception points (TRPs).

Certain aspects of the present disclosure generally relate to methods and apparatus for decoding low density parity check (LDPC) encoded transmissions, and more particularly to decoding LDPC encoded transmissions using a parity check matrix with a large number of pairwise fully row-orthogonal rows.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method, which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as Long Term Evolution (LTE), Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95, and IS-856 standards. A TDMA network may implement a radio technology such as Global System for Mobile Communications (GSM). An OFDMA network may implement a radio technology such as NR (e.g., 5G RA), Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS, and LTE are described in documents from an organization named "3rd Generation Partnership Project" (3GPP). CDMA2000 is described in documents from an organization named "3rd Generation Partnership Project 2" (3GPP2). NR is an emerging wireless communications technology under development in conjunction with the 5G Technology Forum (5GTF). These communications networks are merely listed as examples of networks in which the techniques described in this disclosure may be applied; however, this disclosure is not limited to the above-described communications network.

Single carrier frequency division multiple access (SC-FDMA) is a transmission technique that utilizes single carrier modulation at a transmitter side and frequency domain equalization at a receiver side. The SC-FDMA has similar performance and essentially the same overall complexity as those of OFDMA system. However, SC-FDMA signal has lower peak-to-average power ratio (PAPR) because of its inherent single carrier structure. The SC-FDMA has drawn great attention, especially in the uplink (UL) communications where lower PAPR greatly benefits the wireless node in terms of transmit power efficiency.

An access point ("AP") may comprise, be implemented as, or known as NodeB, Radio Network Controller ("RNC"), eNodeB (eNB), Node B (e.g., 5G Node B), transmission reception point (TRP), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or be known as an access terminal, a subscriber station, a subscriber unit, a mobile station, a remote station, a remote terminal, a user terminal, a user agent, a user device, user equipment (UE), a user station, a wireless node, or some other terminology. In some implementations, an access terminal may comprise a cellular telephone, a smart phone, a cordless telephone, a Session Initiation Protocol ("SIP") phone, a wireless local loop ("WLL") station, a personal digital assistant ("PDA"), a tablet, a netbook, a smartbook, an ultrabook, a handheld device having wireless connection capability, a Station ("STA"), or some other suitable processing device connected to a wireless modem. Accordingly, one or more aspects taught herein may be incorporated into a phone (e.g., a cellular phone, a smart phone), a computer (e.g., a desktop), a portable communication device, a portable computing device (e.g., a laptop, a personal data assistant, a tablet, a netbook, a smartbook, an ultrabook), medical devices or equipment, biometric sensors/devices, an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium. In some aspects, the node is a wireless node. A wireless node may provide, for example, connectivity for or to a network (e.g., a wide area network such as the Internet or a cellular network) via a wired or wireless communication link.

While aspects may be described herein using terminology commonly associated with 3G and/or 4G wireless technologies, aspects of the present disclosure can be applied in other generation-based communication systems, such as 5G and later, including NR technologies.

An Example Wireless Communication System

FIG. 1 illustrates an example communications network 100 in which aspects of the present disclosure may be performed. As illustrated, A Node B 102 (e.g., a TRP or 5G Node B) may include multiple antenna groups, one group including antennas 104 and 106, another group including antennas 108 and 110, and an additional group including antennas 112 and 114. In FIG. 1, only two antennas are shown for each antenna group, however, more or fewer antennas may be utilized for each antenna group. Wireless node 116 may be in communication with antennas 112 and 114, where antennas 112 and 114 transmit information to wireless node 116 over forward link 120 and receive information from wireless node 116 over reverse link 118. Wireless node 122 may be in communication with antennas 106 and 108, where antennas 106 and 108 transmit information to wireless node 122 over forward link 126 and receive information from wireless node 122 over reverse link 124. The Node B 102 may also be in communication with other wireless nodes, which may be, for example, Internet-of-Things (IoT) devices. IoT device 136 may be in communication with one or more other antennas of Node B 102, where the antennas transmit information to IoT device 136 over forward link 140 and receive information from IoT device 136 over reverse link 138. IoT device 142 may be in communication with one or more other antennas of Node B 102, where the antennas transmit information to IoT device 142 over forward link 146 and receive information from IoT device 142 over reverse link 144. In a Frequency Division Duplex (FDD) system, communication links 118, 120, 124, 126, 138, 140, 144, and 146 may use different frequency for communication. For example, forward link 120 may use a different frequency than that used by reverse link 118, and forward link 140 may use a different frequency than that used by reverse link 138.

Each group of antennas and/or the area in which they are designed to communicate is often referred to as a sector of the Node B. In one aspect of the present disclosure, each antenna group may be designed to communicate to wireless nodes in a sector of the areas covered by Node B 102.

Wireless node 130 may be in communication with Node B 102, where antennas from the Node B 102 transmit information to wireless node 130 over forward link 132 and receive information from the wireless node 130 over reverse link 134.

In communication over forward links 120 and 126, the transmitting antennas of BS 102 may utilize beamforming in order to improve the signal-to-noise ratio of forward links for the different wireless nodes 116, 122, 136, and 142. Also, a Node B using beamforming to transmit to wireless nodes scattered randomly through its coverage causes less interference to wireless nodes in neighboring cells than a Node B transmitting through a single antenna to all its wireless nodes.

While aspects of the examples described herein may be associated with LTE technologies, aspects of the present disclosure may be applicable with other wireless communications systems, such as NR. NR may utilize orthogonal frequency-division multiplexing (OFDM) with a CP on the uplink and downlink and include support for half-duplex operation using time division duplex (TDD). A single component carrier bandwidth of 100 MHZ may be supported. NR resource blocks may span 12 sub-carriers with a sub-carrier bandwidth of 75 kHz over a 0.1 ms duration. Each radio frame may consist of 2 half frames, each half frame consisting of 5 subframes, with a length of 10 ms. Consequently, each subframe may have a length of 1 ms. Each subframe may indicate a link direction (i.e., downlink (DL) or uplink (UL)) for data transmission and the link direction for each subframe may be dynamically switched. Each subframe may include DL/UL data as well as DL/UL control data. Beamforming may be supported and beam direction may be dynamically configured. MIMO transmissions with precoding may also be supported. MIMO configurations in the DL may support up to 8 transmit antennas with multi-layer DL transmissions with up to 8 streams. Multi-layer transmissions with up to 2 streams per UE may be supported. Aggregation of multiple cells may be supported with up to 8 serving cells. Alternatively, NR may support a different air interface, other than an OFDM-based interface. NR networks may include entities such central units or distributed units.

Figure 2:
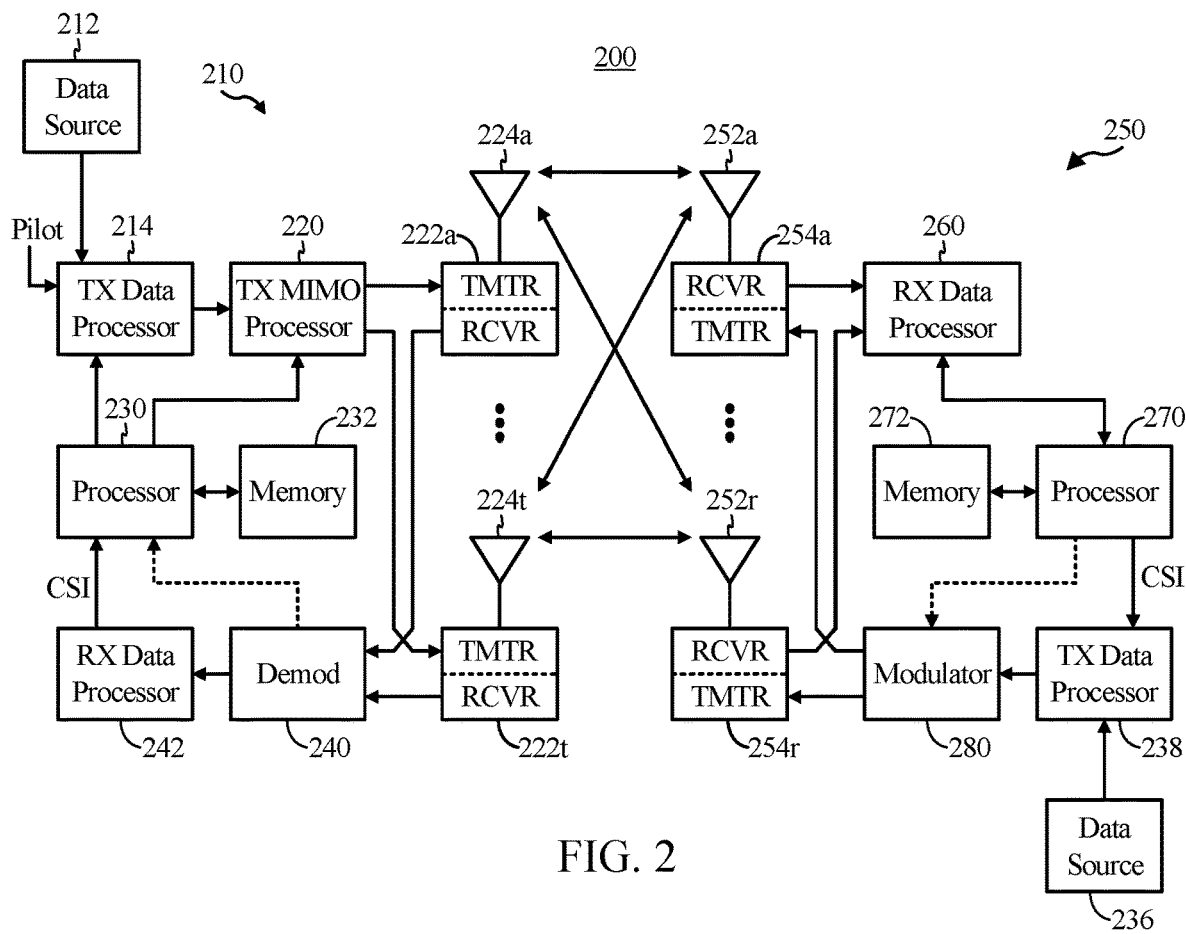
FIG. 2 illustrates a block diagram of a base station and a wireless node, according to certain aspects of the present disclosure.

FIG. 2 illustrates a block diagram of an aspect of a transmitter system 210 (e.g., also known as the base station) and a receiver system 250 (e.g., also known as the wireless node) in a multiple-input multiple-output (MIMO) system 200, in which aspects of the present disclosure may be practiced. Each of system 210 and system 250 has capabilities to both transmit and receive. Whether system 210 or system 250 is transmitting, receiving, or transmitting and receiving simultaneously depends on the application. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme (e.g., low-density parity check (LDPC)) selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (e.g., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230. Memory 232 may store data and software/firmware for the transmitter system 210.

The modulation symbols for all data streams are then provided to a TX MIMO processor 220, which may further process the modulation symbols (e.g., for OFDM). TX MIMO processor 220 then provides NT (e.g., where NT is a positive integer) modulation symbol streams to NT transmitters (TMTR) 222a through 222t. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. NT modulated signals from transmitters 222a through 222t are then transmitted from NT antennas 224a through 224t, respectively.

At receiver system 250, the transmitted modulated signals may be received by NR (e.g., where NR is a positive integer) antennas 252a through 252r and the received signal from each antenna 252 may be provided to a respective receiver (RCVR) 254a through 254r. Each receiver 254 may condition (e.g., filters, amplifies, and downconverts) a respective received signal, digitize the conditioned signal to provide samples, and further process the samples to provide a corresponding "received" symbol stream.

A receive (RX) data processor 260 then receives and processes the NR received symbol streams from NR receivers 254 based on a particular receiver processing technique to provide NT "detected" symbol streams. The RX data processor 260 then demodulates, deinterleaves, and decodes each detected symbol stream to recover the traffic data for the data stream. The processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. Memory 272 may store data and software/firmware for the receiver system 250. The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters (TMTR) 254a through 254r, and transmitted back to transmitter system 210.

At transmitter system 210, the modulated signals from receiver system 250 are received by antennas 224, conditioned by receivers (RCVR) 222, demodulated by a demodulator 240, and processed by a RX data processor 242 to extract the reverse link message transmitted by the receiver system 250. Processor 230 then determines which pre-coding matrix to use for determining the beamforming weights, and then processes the extracted message.

Any one of the processor 270, RX data processor 260, other processors/elements, or a combination thereof of the receiver system 250 and/or any one of the processor 230, RX data processor 242, other processors/elements, or a combination thereof of the transmitter system 210 may be configured to perform the procedures for low-density parity-check (LDPC) decoding in accordance with certain aspects of the present disclosure discussed below with reference to FIG. 14. In an aspect, at least one of the processor 270 and RX data processor 260 may be configured to execute algorithms stored in memory 272 for performing the LDPC decoding described herein. In another aspect, at least one of the processor 230 and RX data processor 242 may be configured to execute algorithms stored in memory 232 for performing the LDPC decoding described herein.

Any one of the processor 270, TX data processor 238, other processors/elements, or a combination thereof of the receiver system 250 and/or any one of the processor 230, TX MIMO processor 220, TX data processor 214, other processors/elements, or a combination thereof of the transmitter system 210 may be configured to perform the procedures for low-density parity-check (LDPC) encoding in accordance with certain aspects of the present disclosure discussed below with reference to FIG. 15. In an aspect, at least one of the processor 270 and TX data processor 238 may be configured to execute algorithms stored in memory 272 for performing the LDPC encoding described herein. In another aspect, at least one of the processor 230, TX MIMO processor 220, and TX data processor 214 may be configured to execute algorithms stored in memory 232 for performing the LDPC encoding described herein.

Figure 3:
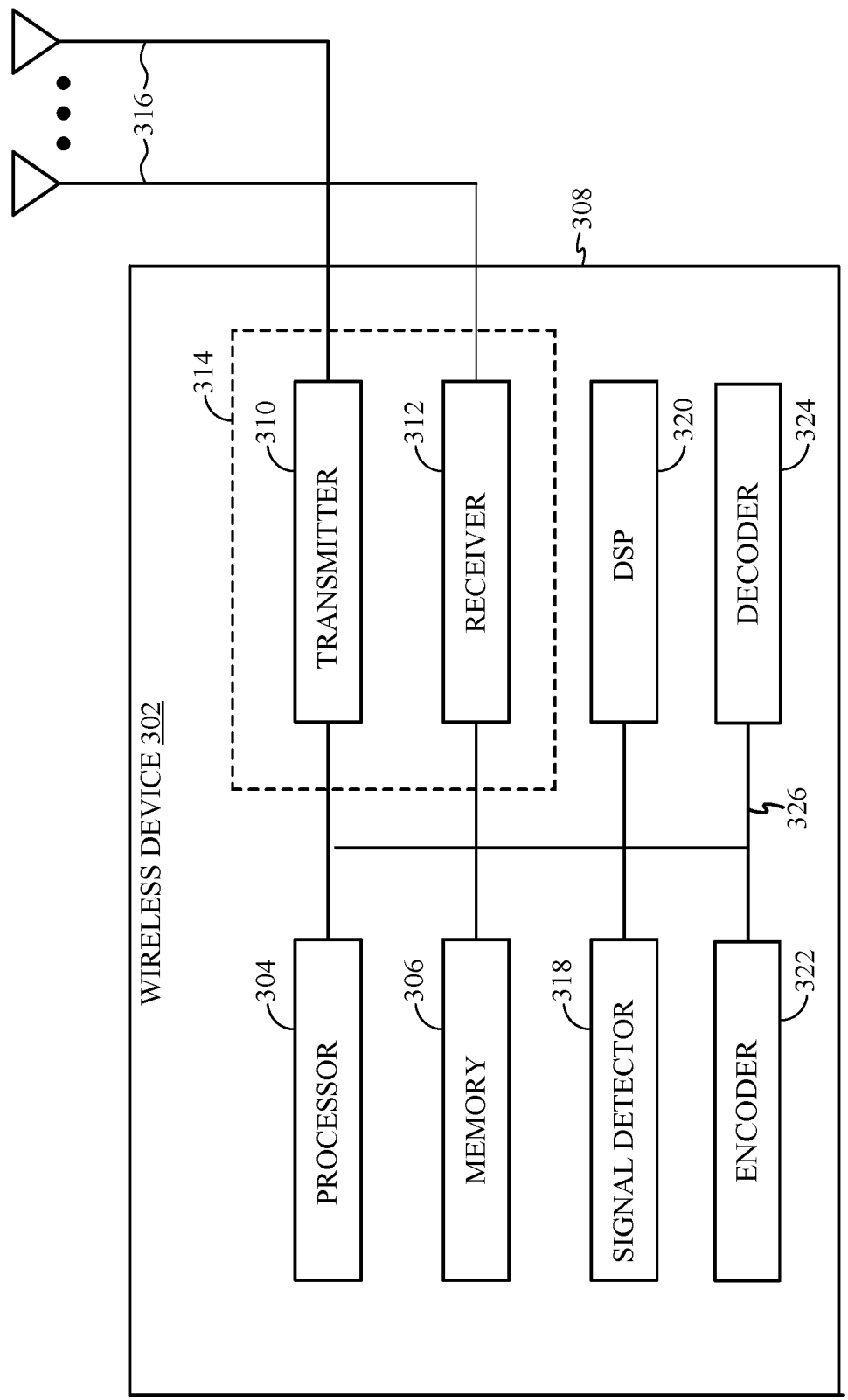
FIG. 3 illustrates various components that may be utilized in a wireless device, according to certain aspects of the present disclosure.

FIG. 3 illustrates various components that may be utilized in a wireless device 302 that may be employed within the wireless communication system 100 illustrated in FIG. 1. The wireless device 302 is an example of a device that may be configured to implement the various methods described herein. The wireless device 302 may be a Node B 102 (e.g., a TRP) or any of the wireless nodes (e.g., wireless nodes 116, 122, 130 or IoT device 136 or 142). For example, the wireless device 302 may be configured to perform operations 1400 and 1500 described in FIGS. 14 and 15, as well as other operations described herein The wireless device 302 may include a processor 304 that controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein, for example, to allow a UE to perform LDPC decoding and/or LDPC encoding. Some non-limiting examples of the processor 304 may include a Snapdragon processor, application specific integrated circuits (ASICs), programmable logic, etc.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single or a plurality of transmit antennas 316 may be attached to the housing 308 and electrically coupled to the transceiver 314. The wireless device 302 may also include (not shown) multiple transmitters, multiple receivers, and multiple transceivers. The wireless device 302 can also include wireless battery charging equipment.

The wireless device 302 may also include a signal detector 318 that may be used in an effort to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

Additionally, the wireless device may also include an encoder 322 for use in encoding signals for transmission and a decoder 324 for use in decoding received signals. According to certain aspects, the encoder 322 may perform encoding according to certain aspects presented herein (e.g., by implementing operations 1500 illustrated in FIG. 15). According to certain aspects, the decoder 324 may perform decoding according to certain aspects presented herein (e.g., by implementing operations 1400 illustrated in FIG. 14).

The various components of the wireless device 302 may be coupled together by a bus system 326, which may include a power bus, a control signal bus, and a status signal bus in addition to a data bus. The processor 304 may be configured to access instructions stored in the memory 306 to perform LDPC decoding and/or LDPC encoding, in accordance with aspects of the present disclosure discussed below.

Example Error Correction Coding

Many communications systems use error-correcting codes. Specifically, error-correcting codes compensate for the intrinsic unreliability of information transfer in these systems by introducing redundancy into the data stream. Low-density parity check (LDPC) codes are a particular type of error correcting codes which use an iterative coding system. In particular, Gallager codes are an early example of regular LDPC codes. LDPC codes are linear block codes in which most of the elements of its parity check matrix H are set to '0'.

LDPC codes can be represented by bipartite graphs (often referred to as "Tanner graphs"), wherein a set of variable nodes corresponds to bits of a code word (e.g., information bits or systematic bits), and a set of check nodes correspond to a set of parity-check constraints that define the code. Edges in the graph connect variable nodes to check nodes. Thus, the nodes of the graph are separated into two distinctive sets, variable nodes and check nodes, with edges connecting the two different types of nodes.

A lifted graph is created by copying a bipartite base graph (G), which may also be known as a protograph, a number of times, Z. A variable node and a check node may be considered "neighbors" if they are connected by an "edge" (i.e., the line connecting the variable node and the check node) in the graph. In addition, for each edge (e) of the bipartite base graph (G), a permutation is applied to the Z copies of edge (e) to interconnect the Z copies of G. A bit sequence having a one-to-one association with the variable node sequence is a valid codeword if, and only if, for each check node, the bits associated with all neighboring variable nodes sum to zero modulo two (i.e., they include an even number of 1's). The resulting LDPC code may be quasi-cyclic (QC) if the permutations used are cyclic.

Figures 4A, 4B:
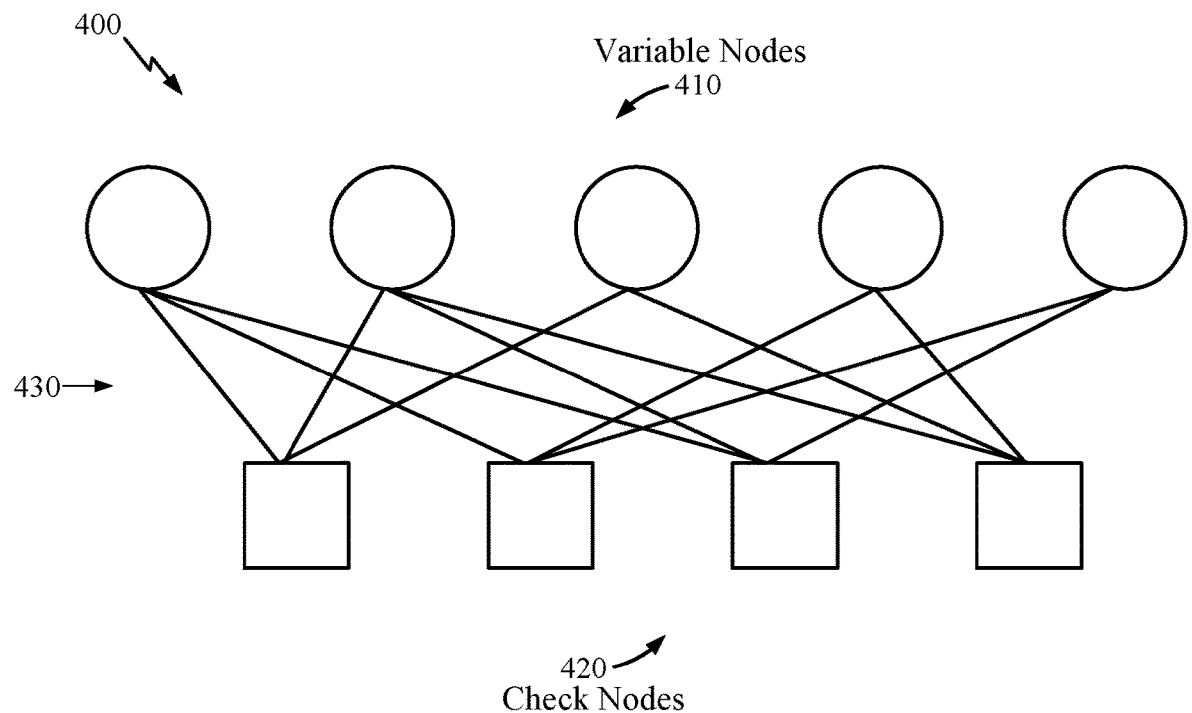
FIGS. 4A-4B show graphical and matrix representations of an exemplary low density parity check (LDPC) code, according to certain aspects of the present disclosure.

FIGS. 4A-4B show graphical and matrix representations of an exemplary LDPC code, in accordance with certain aspects of the present disclosure. For example, FIG. 4A shows a bipartite graph 400 representing an exemplary LDPC code. The bipartite graph 400 includes a set of 5 variable nodes 410 (represented by circles) connected to 4 check nodes 420 (represented by squares). Edges 430 in the graph 400 connect variable nodes 410 to the check nodes 420 (represented by the lines connecting the variable nodes 410 to the check nodes 420). This graph consists of $|V|=5$ variable nodes and $|C|=4$ check nodes, connected by $|E|=12$ edges.

The bipartite graph may be represented by a simplified adjacency matrix, which may also be known as a parity check matrix. FIG. 4B shows a matrix representation 450 of the bipartite graph 400. The matrix representation 450 includes a parity check matrix H and a code word vector x, where $x_1$-$x_5$ represent bits of the code word x. The parity matrix H is used for determining whether a received signal was normally decoded. The parity check matrix H has C rows corresponding to j check nodes and V columns corresponding to i variable nodes (i.e., a demodulated symbol), where the rows represent the equations and the columns represents the bits of the code word. In FIG. 4B, matrix H has 4 rows and 5 columns corresponding to 4 check nodes and 5 variable nodes respectfully. If a j-th check node is connected to an i-th variable node by an edge, i.e., the two nodes are neighbors, then there is a 1 in the element at the i-th column and the j-th row of the parity check matrix H. That is, the intersection of an i-th row and a j-th column contains a "1" where an edge joins the corresponding vertices and a "0" where there is no edge joining the corresponding vertices. The code word vector x represents a valid code word if, and only if, Hx=0 (e.g., if, for each constraint node, the bits neighboring the constraint (via their association with variable nodes) sum to zero modulo two, i.e., they comprise an even number of ones). Thus, if the code word is received correctly, then Hx=0 (mod 2). When the product of a coded received signal and the parity check matrix H becomes '0', this signifies that no error has occurred. The parity check matrix is a C row by V column binary matrix. The rows represent the equations and the columns represent the digits in the code word.

The number of demodulated symbols or variable nodes is the LDPC code length. The number of non-zero elements in a row is defined as the row weight dc. The number of non-zero elements in a column is defined as the column weight dv.

The degree of a node refers to the number of edges connected to that node. This feature is illustrated in the H matrix shown in FIG. 4B where the number of edges incident to a variable node 410 is equal to the number of 1's in the corresponding column and is called the variable node degree d(v). Similarly, the number of edges connected with a check node 420 is equal to the number of ones in a corresponding row and is called the check node degree d(c).

A regular graph or code is one for which all variable nodes have the same degree, j, and all constraint nodes have the same degree, k. In this case, the code may be referred to a (j, k) regular code. On the other hand, an irregular code has constraint nodes and/or variable nodes of differing degrees. For example, some variable nodes may be of degree 4, others of degree 3 and still others of degree 2.

"Lifting" enables LDPC codes to be implemented using parallel encoding and/or decoding implementations while also reducing the complexity typically associated with large LDPC codes. Lifting helps enable efficient parallelization of LDPC decoders while still having a relatively compact description. More specifically, lifting is a technique for generating a relatively large LDPC code from multiple copies of a smaller base code. For example, a lifted LDPC code may be generated by producing Z number of parallel copies of a base graph (e.g., protograph) and then interconnecting the parallel copies through permutations of edge bundles of each copy of the base graph. The base graph defines the (macro) structure of the code and consists of a number (K) of information bit-columns and a number (N) of code bit columns. Lifting the base graph a number (Z) of results in a final information block length of KZ. Some information bits can be shortened (set to 0) to realize information block lengths less than KZ.

Thus, a larger graph can be obtained by a "copy and permute" operation where multiple copies of the base graph are made and connected to form a single lifted graph. For the multiple copies, like edges that are a set of copies of a single base edge, are permutated and connected to form a connected graph Z times larger than the base graph.

Figure 5:
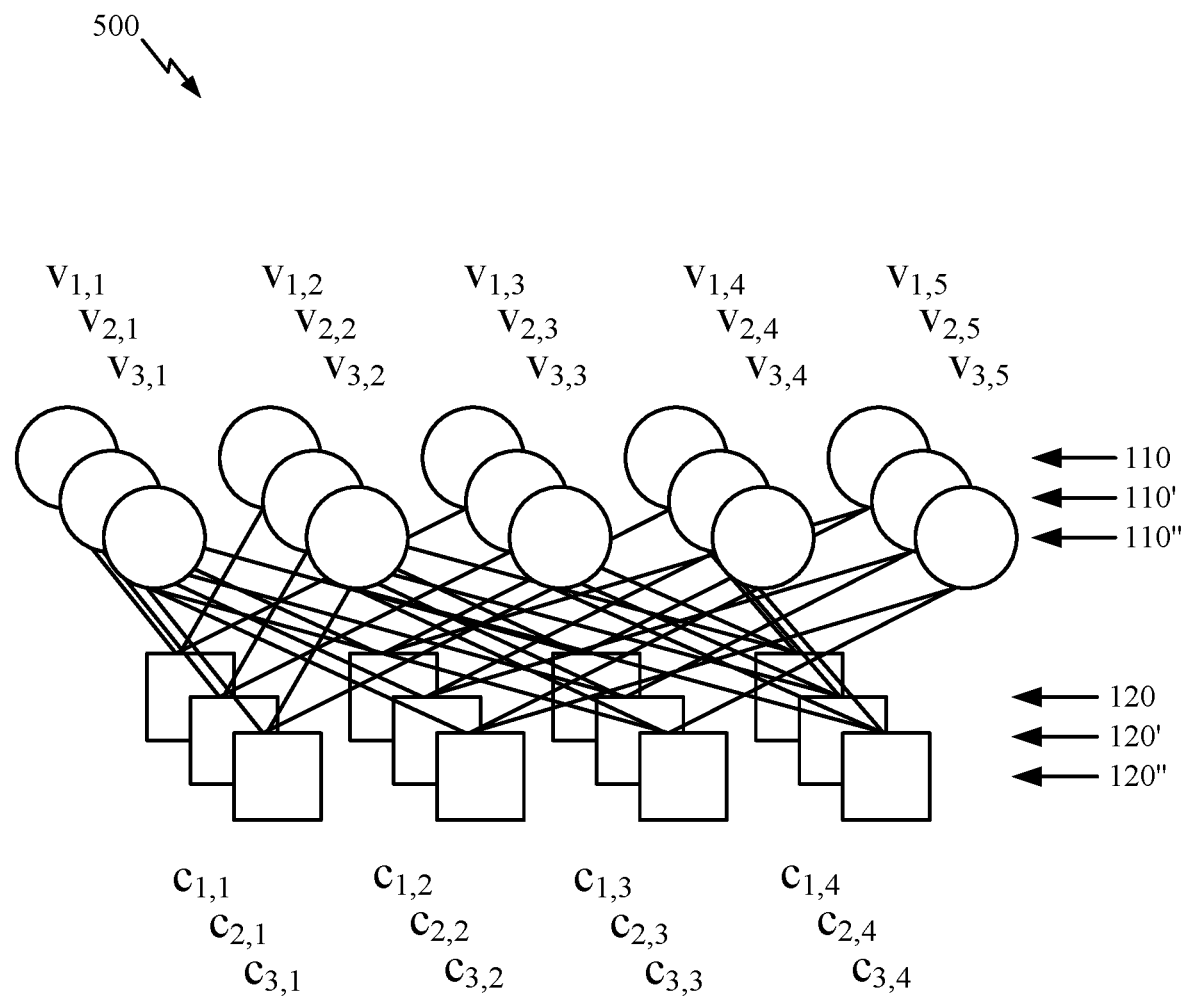
FIG. 5 graphically illustrates lifting of the LDPC code of FIG. 4A, according to certain aspects of the present disclosure.

FIG. 5 graphically illustrates the effect of making three copies of the graph of FIG. 4A. Three copies may be interconnected by permuting like edges among the copies. If the permutations are restricted to cyclic permutations, then the resulting graph corresponds to a quasi-cyclic LDPC with lifting Z=3. The original graph from which three copies were made is referred to herein as the base graph. To obtain derived graphs of different sizes, one can apply the "copy and permute" operation to a base graph.

A corresponding parity check matrix of the lifted graph can be constructed from the parity check matrix of the base graph by replacing each entry in the base parity check matrix with a Z×Z matrix. The 0 entries (those having no base edges) are replaced with the 0 matrix and the 1 entries (indicating a base edge) are replaced with a Z×Z permutation matrix. In the case of cyclic liftings the permutations are cyclic permutations.

A cyclically lifted LDPC code can also be interpreted as a code over the ring of binary polynomials modulo $x^Z+1$. In this interpretation, a binary polynomial, $(x)=b_0+b_1 x+b_2 jx^2+\ldots+b_{Z-1} x^{Z-1}$ may be associated to each variable node in the base graph. The binary vector $(b_0, b_1, b_2, \ldots, b_{Z-1})$ corresponds to the bits associated to Z corresponding variable nodes in the lifted graph, that is, Z copies of a single base variable node. A cyclic permutation by k of the binary vector is achieved by multiplying the corresponding binary polynomial by $x^k$, where multiplication is taken modulo $x^Z+1$. A degree d parity check in the base graph can be interpreted as a linear constraint on the neighboring binary polynomials $B_1(x), B_d(x)$ written as $x^{k_1} B_1(x)+x^{k_2} B_2(x)++x^{k_d} B_d(x)=0$ where the values, $k_d$ are the cyclic lifting values associated to the corresponding edges.

This resulting equation is equivalent to the Z parity checks in the cyclically lifted Tanner graph corresponding to the single associated parity check in the base graph. Thus, the parity check matrix for the lifted graph can be expressed using the matrix for the base graph in which 1 entries are replaced with monomials of the form $x^k$ and 0 entries are lifted as 0, but now the 0 is interpreted as the 0 binary polynomial modulo $x^Z+1$. Such a matrix may be written by giving the value k in place of $x^k$. In this case the 0 polynomial is sometimes represented as −1 and sometimes as another character in order to distinguish it from $x^0$.

Figure 6:
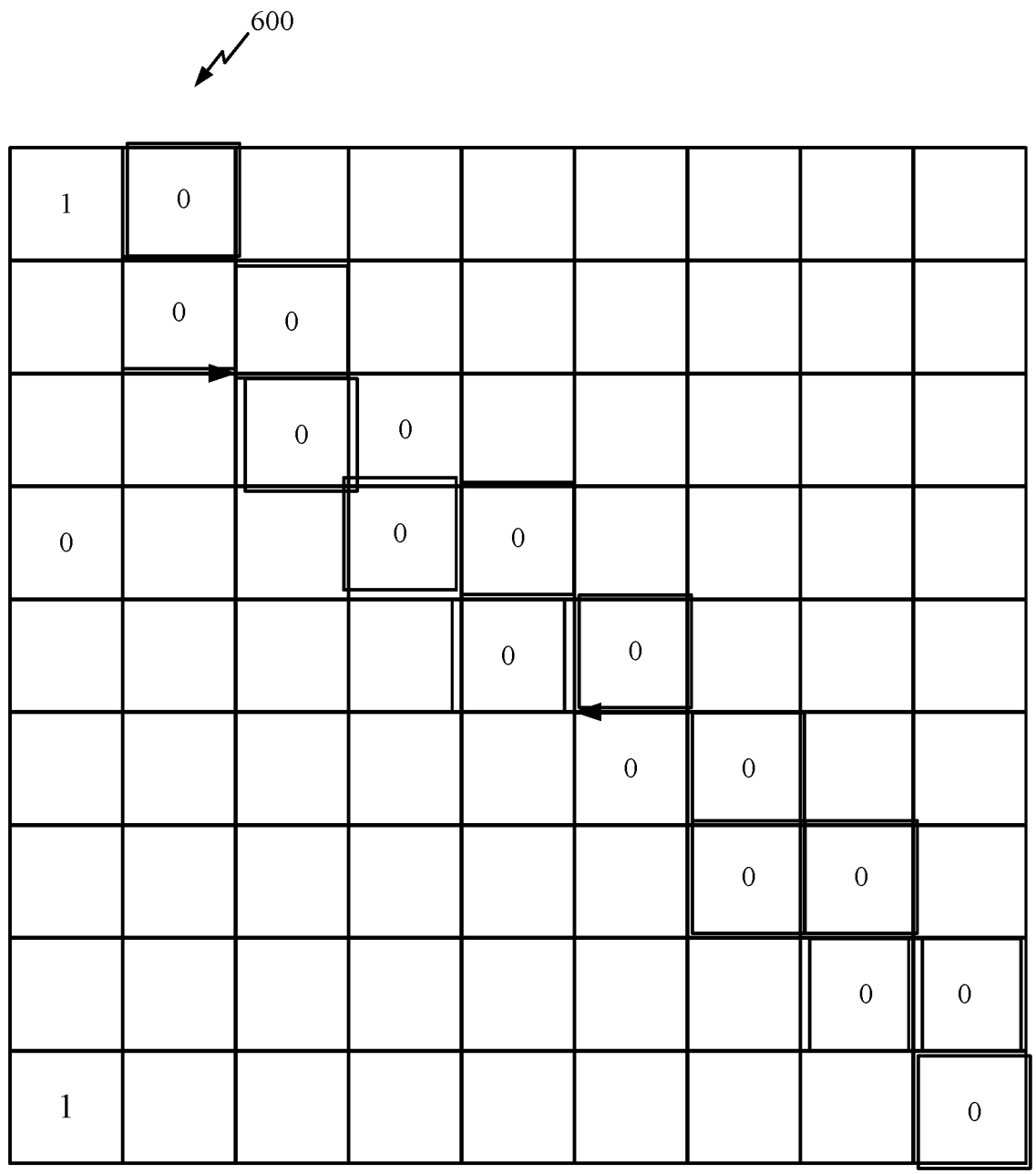
FIG. 6 is an integer representation of a matrix for a quasi-cyclic IEEE 802.11 LDPC code.

Typically, a square submatrix of the parity check matrix represents the parity bits of the code. The complementary columns correspond to information bits that, at the time of encoding, are set equal to the information bits to be encoded. The encoding may be achieved by solving for the variables in the aforementioned square submatrix in order to satisfy the parity check equations. The parity check matrix H may be partitioned into two parts M and N where M is the square portion. Thus, encoding reduces to solving Mc=s=Nd where c and d comprise x. In the case of quasi-cyclic codes, or cyclically lifted codes, the above algebra can be interpreted as being over the ring of binary polynomials modulo $x^Z+1$. In the case of the IEEE 802.11 LDPC codes, which are quasi-cyclic, the encoding submatrix M has an integer representation as shown in FIG. 6.

A received LDPC code word can be decoded to produce a reconstructed version of the original code word. In the absence of errors, or in the case of correctable errors, decoding can be used to recover the original data unit that was encoded. Redundant bits may be used by decoders to detect and correct bit errors. LDPC decoder(s) generally operate by iteratively performing local calculations and passing those results by exchanging messages within the bipartite graph 400, along the edges, and updating these messages by performing computations at the nodes based on the incoming messages. These steps may typically be repeated several times and may be referred to as message passing steps. For example, each variable node 410 in the graph 400 may initially be provided with a "soft bit" (e.g., representing the received bit of the code word) that indicates an estimate of the associated bit's value as determined by observations from the communications channel. Using these soft bits the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel.

LDPC codes designed for high speed applications often use quasi-cyclic constructions with large lifting factors and relatively small base graphs to support high parallelism in encoding and decoding operations. LDPC codes with higher code rates (e.g., the ratio of the message length to the code word length) tend to have relatively fewer parity checks. If the number of base parity checks is smaller than the degree of a variable node (e.g., the number of edges connected to a variable node), then, in the base graph, that variable node is connected to at least one of the base parity checks by two or more edges (e.g., the variable node may have a "double edge"). Or if the number of base parity checks is smaller than the degree of a variable node (e.g., the number of edges connected to a variable node), then, in the base graph, that variable node is connected to at least one of the base parity checks by two or more edges. Having a base variable node and a base check node connected by two or more edges is generally undesirable for parallel hardware implementation purposes. For example, such double edges may result in multiple concurrent read and write operations to the same memory locations, which in turn may create data coherency problems. A double edge in a base LDPC code may trigger parallel reading of the same soft bit value memory location twice during a single parallel parity check update. Thus, additional circuitry is typically needed to combine the soft bit values that are written back to memory, so as to properly incorporate both updates. However, eliminating double edges in the LDPC code helps to avoid this extra complexity In the definition of standard irregular LDPC code ensembles (degree distributions), all edges in the Tanner graph representation may be statistically interchangeable. In other words, there exists a single statistical equivalence class of edges. A more detailed discussion of lifted LDPC codes may be found, for example, in the book titled, "Modern Coding Theory," published Mar. 17, 2008, by Tom Richardson and Ruediger Urbanke. For multi-edge LDPC codes, multiple equivalence classes of edges may be possible. While in the standard irregular LDPC ensemble definition, nodes in the graph (both variable and constraint) are specified by their degree, i.e., the number of edges they are connected to, in the multi-edge type setting an edge degree is a vector; it specifies the number of edges connected to the node from each edge equivalence class (type) independently. A multi-edge type ensemble is comprised of a finite number of edge types. The degree type of a constraint node is a vector of (non-negative) integers; the i-th entry of this vector records the number of sockets of the i-th type connected to such a node. This vector may be referred to as an edge degree. The degree type of a variable node has two parts, although the degree type can be viewed as a vector of (non-negative) integers. The first part relates to the received distribution and will be termed the received degree and the second part specifies the edge degree. The edge degree plays the same role as for constraint nodes. Edges are typed as they pair sockets of the same type. This constraint that sockets must pair with sockets of like type characterizes the multi-edge type concept. In a multi-edge type description, different node types can have different received distributions (e.g., the associated bits may go through different channels).

Figure 7:
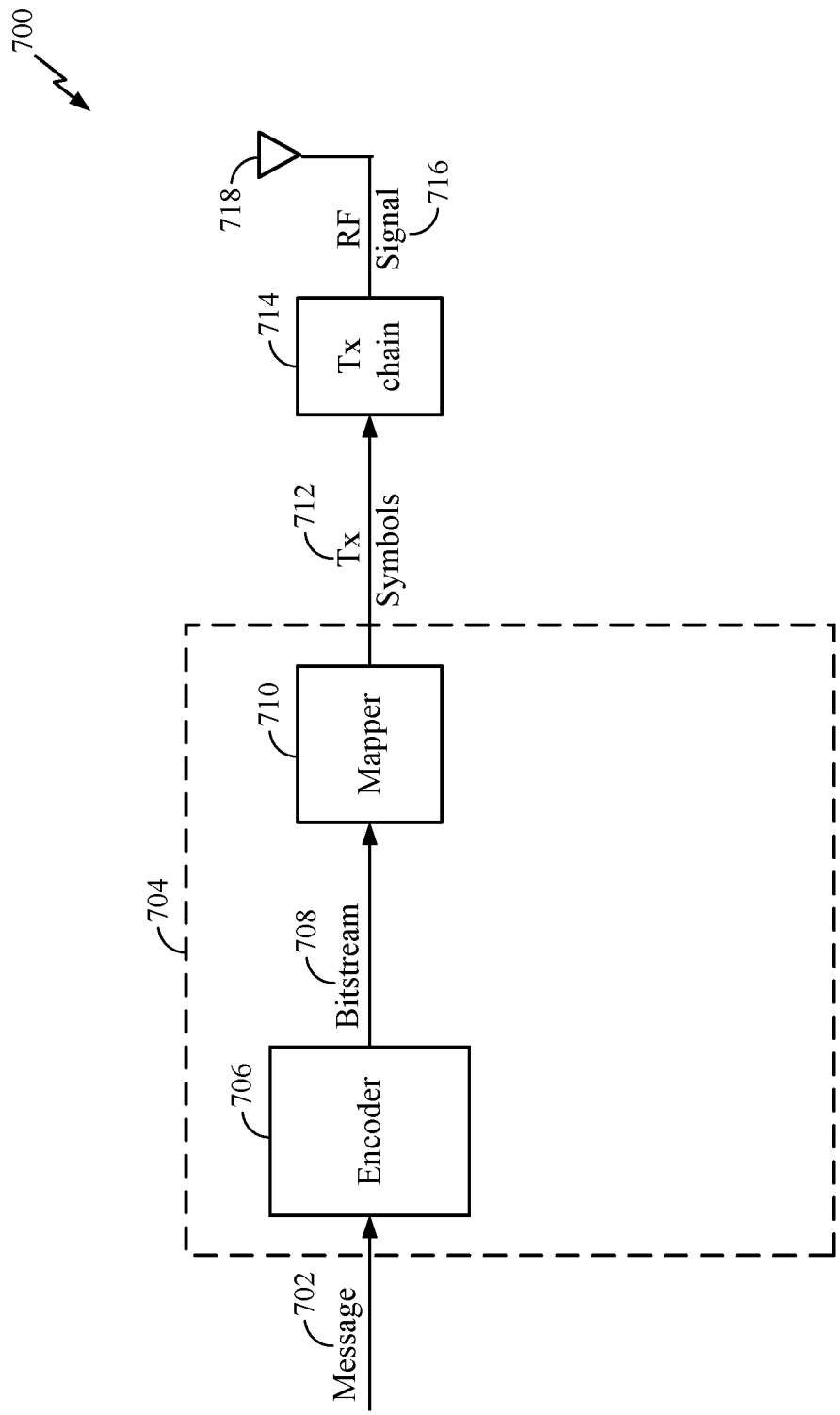
FIG. 7 is a simplified block diagram illustrating an encoder, according to certain aspects of the present disclosure.

FIG. 7 illustrates a portion 704 of a radio frequency (RF) modem 700 that may be configured to provide an encoded message for wireless transmission. In one example, an encoder 706 in a base station (e.g., Node B 102 and/or transmitter system 210) (or wireless node on the reverse path) receives information bits of a message 702 for transmission. The message 702 may contain data and/or encoded voice or other content directed to the receiving device. The encoder 706 encodes the message using a suitable modulation and coding scheme (MCS), typically selected based on a configuration defined by the base station or another network entity. In some cases, the encoder 706 may encode the message, for example, in accordance with aspects of the present disclosure (e.g., by implementing operations 1500 illustrated in FIG. 15). An encoded bitstream 708 produced by the encoder 706 may then be provided to a mapper 710 that generates a sequence of Tx symbols 712 that are modulated, amplified and otherwise processed by Tx chain 714 to produce an RF signal 716 for transmission through antenna 718.

Figure 8:
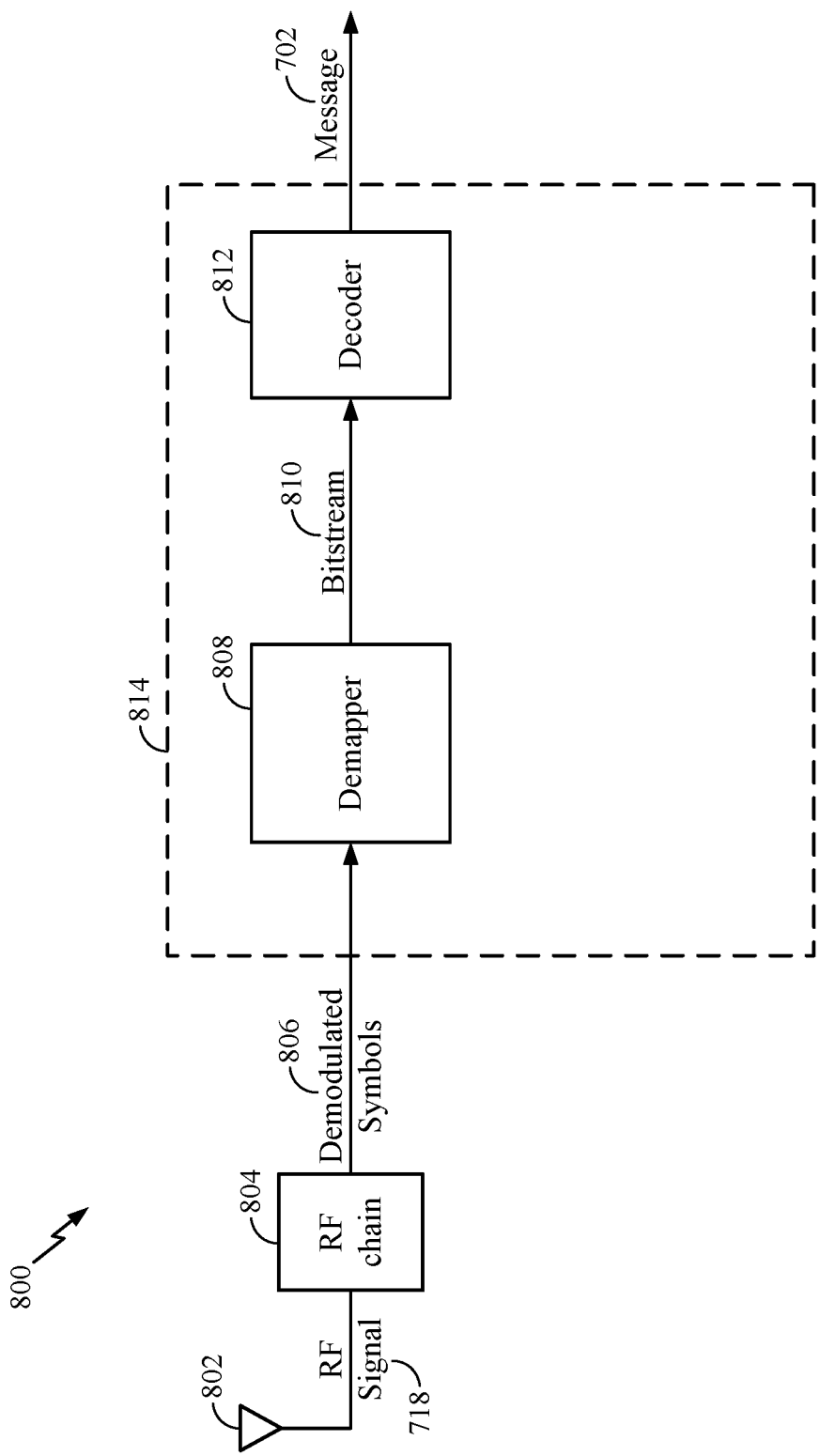
FIG. 8 is a simplified block diagram illustrating a decoder, according to certain aspects of the present disclosure.

FIG. 8 illustrates a portion 814 of a RF modem 800 that may be configured to receive and decode a wirelessly transmitted signal including an encoded message (e.g., a message encoded using a LDPC code as described above). In various examples, the modem 814 receiving the signal may reside at the wireless node (e.g., wireless node 116, receiver system 250), at the base station (e.g., Node B 102, transmitter system 210), or at any other suitable apparatus or means for carrying out the described functions (e.g., wireless device 302). An antenna 802 receives an RF signal 816 (e.g., the RF signal 716, produced in FIG. 7, as altered by the effective channel between RF chain 700 and RF chain 800) for a wireless node (e.g., wireless node 116, 122, and/or receiver system 250). An RF chain 804 processes and demodulates the RF signal 816 and may provide a sequence of demodulated symbols 806 to a demapper 808, which produces a bitstream (e.g., a series of received values r_j, that may be referred to as soft bits or scaled soft bits and may be represented by log-likelihood ratios) 810 representative of the encoded message.

A decoder 812 may then be used to decode m-bit information strings from a bitstream that has been encoded using a coding scheme (e.g., an LDPC code). The decoder 812 may comprise a layered LDPC decoder with a full-parallel, row-parallel, or block-parallel architecture. LDPC decoder(s) generally operate by iteratively performing local calculations and passing those results by exchanging messages within the bipartite graph 400, along the edges, and updating these messages by performing computations at the nodes based on the incoming messages. These steps may typically be repeated several times and may be referred to as message passing steps. For example, each variable node 410 in the graph 400 may initially be provided with a "soft bit" (e.g., representing the received bit, r_j, of the codeword) that indicates an estimate of the associated bit's value as determined by observations from the communications channel. The "soft bit" may be represented by a log-likelihood ratio (LLR) that in some aspects may be defined as the log ((probability the bit is 0)/(probability the bit is 1)). Using these LLRs, the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel. According to aspects of the present disclosure, following these decoding techniques, the decoder 812 may decode the bitstream 810 based on the LLRs to determine the message 702 containing data, encoded voice and/or other content transmitted from the base station (e.g., Node B 102 and/or transmitter system 210). The decoder may decode the bitstream 810 in accordance with aspects of the present disclosure presented below (e.g., by implementing operations 1400 illustrated in FIG. 14).

Example LDPC Decoder Architecture

Low-density parity check (LDPC) coding is a powerful error correcting coding technology used in several applications such as wireless communications, storage, and Ethernet. LDPC is based on designing codes on bipartite graphs, for example, as described above and illustrated in FIG. 4A. LDPC decoding is typically implemented using belief propagation techniques, described above, where messages are passed along edges of the graph and the nodes in the graph compute their marginal distributions from which decisions on the source symbols can be made. Quasi-Cyclic (QC) codes are a popular class of structured LDPC codes where a base LDPC Parity Check Matrix (PCM) gets 'lifted'. For example, "lifting" entails replacing each base PCM entry with a Z×Z submatrix. The Z×Z submatrix can be a matrix of all zeros for '0' base PCM entries or a cyclically rotated identity matrix for '1' base PCM entries. QC LDPC codes enable parallel processing in hardware by enabling decoders, such as the decoder illustrated in FIG. 8, to replicate processing Z times with switching networks to exchange messages.

LDPC decoders implement message passing algorithms which are often close approximations of the Belief Propagation (BP) algorithm. The log BP algorithm for LDPC decoding may be written as:

$$A_{mj} = \sum_{\substack{n \in N(m) \\ n \neq j}} \Psi(L(q_{mn})) \quad \text{(eq. 1)}$$

$$s_{mj} = \prod_{\substack{n \in N(m) \\ n \neq j}} \text{Sign}(L(q_{mn})) \quad \text{(eq. 2)}$$

$$R_{mj} = s_{mj} \Psi(A_{mj}) \quad \text{(eq. 3)}$$

$$L(q_j) = \sum_{m \in M(j)} R_{mj} + R_j \quad \text{(eq. 4)}$$

$$L(q_{mj}) = L(q_j) - R_{mj} \quad \text{(eq. 5)}$$

where $L(c)$ is a log-likelihood ratio (LLR) associated to the binary variable c defined as $$L(c) = \log \frac{\text{Probability } c = 0}{\text{Probability } c = 1}$$

where the probability is conditioned on certain information implicit in the message passing algorithm that expands as the algorithm proceeds. The function $\psi$ is given by $$\Psi(x) = \log \coth\left(\left|\frac{x}{2}\right|\right).$$

The index m generally denotes a binary parity check node or binary PCM row index, j and n generally denote is the bit node or PCM column index $q_j$ denotes the bit value associated to variable node j, equivalently to the j-th binary PCM column, and $q_{mn}$ denotes the binary value associated to the edge connecting variable node n to check node m, N(m) is the set of all bit indices for bits connected to parity check node m, M(j) is the set of all parity check node indices for all parity check nodes connected to bit j, and $R_j$ is the LLR for bit j associated to the transmission observation of bit j. For example, in a standard BPSK transmission over an AWGN channel we have $$R_j = \frac{2r_j}{\sigma^2}$$

where $r_j$ is the received value, and $\sigma^2$ is the variance of the channel's additive noise. The algorithm may be initialized by setting $L(q_{mj})$ equal to $R_1$ and proceeds by repeated evaluation of the given equations. According to aspects of the present disclosure, Equation 1 computes a parity check metric $A_{mj}$ for bit j that sums the incoming bit LLRs $L(q_{mn})$ for all bits connected to parity check node m (other than the LLR for bit j) through a transformation $\psi$. This operation, along with Equation 3, computes an a posteriori LLR, $R_{mj}$, for bit j based on observations of the other bits belonging to the parity check m. Equation 2 computes the sign, $s_{mj}$, of the a posteriori LLR, $R_{mj}$, based on the signs of the incoming bit LLRs $L(q_{mn})$. Equation 4 calculates the updated bit LLRs, $L(q_j)$, by combining all of the a posteriori LLRs (i.e., extrinsic LLRs) from the decoder for bit j with the a priori LLR $R_1$ from the channel (i.e., intrinsic LLR). Equation 5 subtracts the extrinsic LLR $R_{mj}$ for parity check node m from the bit LLR sum $L(q_1)$ before the bit LLR sum $L(q_{mj})$ is passed back to parity check node m for computation of an updated a posteriori and/or extrinsic LLR $R_{mj}$ in the next iteration. For a 'flooding' LDPC decoder iteration, steps 1-3 (i.e., computing Equations 1-3) are performed for all parity check nodes after which all bit (variable) nodes perform step 4 (i.e., compute Equation 4) to update the bit LLRs $L(q_1)$.

Layered LDPC decoders perform steps similar to Equations 1-5 above, but with some slight modifications. For example, the layered log BP algorithm may be written as:

$$L(q_{mj}) = L(q_j) - R_{mj} \quad \text{(eq. 6)}$$

$$A_{mj} = \sum_{\substack{n \in N(m) \\ n \neq j}} \Psi(L(q_{mn})) \quad \text{(eq. 7)}$$

$$s_{mj} = \prod_{\substack{n \in N(m) \\ n \neq j}} \text{Sign}(L(q_{mn})) \quad \text{(eq. 8)}$$

$$R_{mj} = -s_{mj} \Psi(A_{mj}) \quad \text{(eq. 9)}$$

$$L(q_{mj}) = L(q_j) - R_{mj} \quad \text{(eq. 10)}$$

In the above layered decoding steps (i.e., Equations 6-10), the bit LLRs $L(q_j)$ are initialized with the channel bit LLRs $R_j$ According to certain aspects of the present disclosure, a key difference between layered decoding (Equations 6-10) and flooding decoding (Equations 1-5) is that in a layered decoding iteration, when the a posteriori LLR, $R_{mj}$, is computed for a particular parity check node (PCM row) in Equation 9, the bit LLRs $L(q_j)$ are immediately updated with the new a posteriori LLRs, $R_{mj}$, in Equation 10 before computing the next row's a posteriori LLRs $R_{mj}$ in Equations 6-9. This is in contrast to the flooding decoder, where all of the a posteriori LLRs, $R_{mj}$, corresponding to the PCM rows are computed (Equations 1-3 loop over all m and j) before all of the bit LLRs $L(q_j)$ are updated with the a posteriori LLRs, $R_{mj}$, in Equation 4. As a result, layered decoding allows information, in the form of updated a posterior LLRs, $R_{mj}$, to propagate through the belief propagation message passing faster than a flooding decoder, which results in faster decoder convergence.

Figure 9:
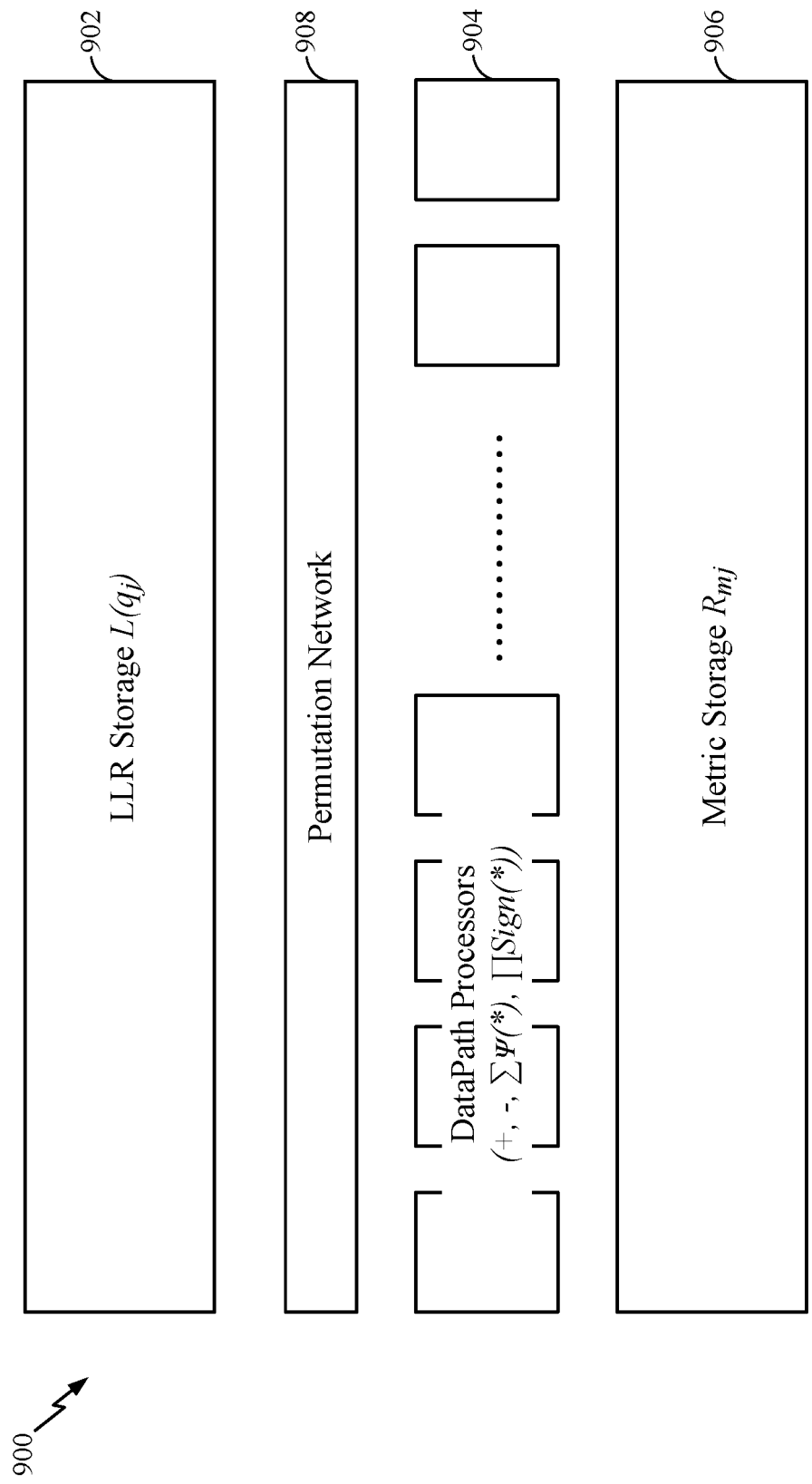
FIG. 9 illustrates a high level block diagram of a generic layered LDPC decoder, according to certain aspects of the present disclosure

FIG. 9 illustrates a high-level block diagram of a generic layered LDPC decoder 900, which may be an example of the decoder 812 illustrated in FIG. 8. As illustrated, the layered LDPC decoder includes LLR storage memory 902 for storing bit LLRs (e.g., $L(q_j)$) (i.e., one bit LLR per bit of the code word), which is initialized by the channel bit LLRs $$\left(\text{e.g.,} \frac{-2r_j}{\sigma^2}\right),$$

which, in turn, are updated by a posteriori LLRs (e.g., $R_{mj}$). The channel bit LLRs or received LLRs are also known as soft bits or scaled soft bits, and the received value r_j is a soft bit. Layered LDPC decoder 900 also includes data path processors 904 that operate in parallel to compute a posteriori LLRs and update the stored bit LLRs in the LLR storage memory 902. Layered LDPC decoder 900 additionally includes a metric storage memory 906 to store a posteriori LLRs computed by the data path processors 904 and a permutation network 908 to route LLRs (e.g., bit LLRs and a posteriori LLRs) between the memories 902, 906 and the data path processors 904.

As discussed above, layered decoding traverses PCM columns (bit LLRs) along a row in the PCM to compute a posteriori LLRs for that row. After a posteriori LLRs for the row are computed, the bit LLRs are each immediately updated with their corresponding a posteriori LLR as they are being fed to the computation of the a posteriori LLRs for the next row. If the column index of the updated bit LLR is connected to the next row, then the updated bit LLR is passed to the a posteriori LLR computation for that next row. If there is no connection, then the updated bit LLR can be stored in LLR storage memory 902.

FIG. 10 illustrates an example of this process for computing/updating bit LLRs and a posteriori LLRs in a parity check matrix (PCM) 1000 as described above. In particular, each cell of the PCM illustrates a calculated a posteriori LLR. For example, for the PCM illustrated in FIG. 10, once the a posteriori LLRs for row 3, labeled 1002, are computed, the bit LLR for column 5, labeled 1010, may be updated (e.g., using Equation 10 from above) and used in the a posteriori LLR computation for row 4, labeled 1006 (e.g., using Equations 6-9 from above), since column 5 is connected to both rows 3 and 4 (e.g., PCM entries (3, 5), labeled 1020, and (4, 5), labeled 1022, are non-zero). However, when the bit LLR for column 6, labeled 1012, is updated with an a posteriori LLR computed from row 3 (labeled 1002), the updated bit LLR is stored in memory (e.g., LLR storage memory 902) because the a posteriori LLR computation for row 4 does not include column 6 given that (4, 6), labeled 1024, is empty. When the a posteriori LLRs for row 5, labeled 1008, are being computed, the bit LLR for column 6 is read from the memory (e.g., LLR storage memory 902) rather than being passed from the prior update computation. It should also be noted that write and read conflicts are possible since Equations 6 and 10 can both read from and write to LLR Storage Memory 902. Such conflicts can create delays in a processing pipeline, if the LLR Storage Memory 902 has just a single read and a single write port.

There can also be delays introduced due to the recursive processing where bit LLR updates for a row (layer) get passed to the a posteriori LLR processing for the next layer for which the computed a posteriori LLRs are used to update the bit LLRs again. For example, given a nonzero processing pipeline depth, there may be a gap between bit LLR update phases so that a posteriori LLR calculations can complete.

Figure 11A:
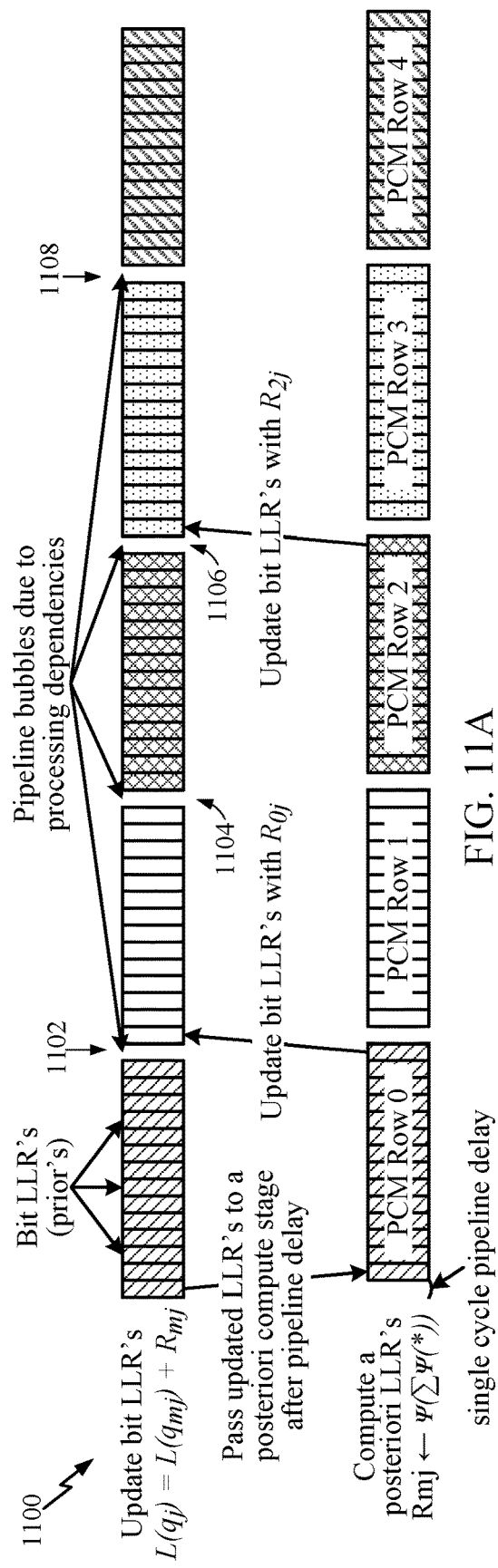
FIGS. 11A and 11B illustrate an example layered decoder pipeline processing timeline, according to certain aspects of the present disclosure.
Figure 11B:
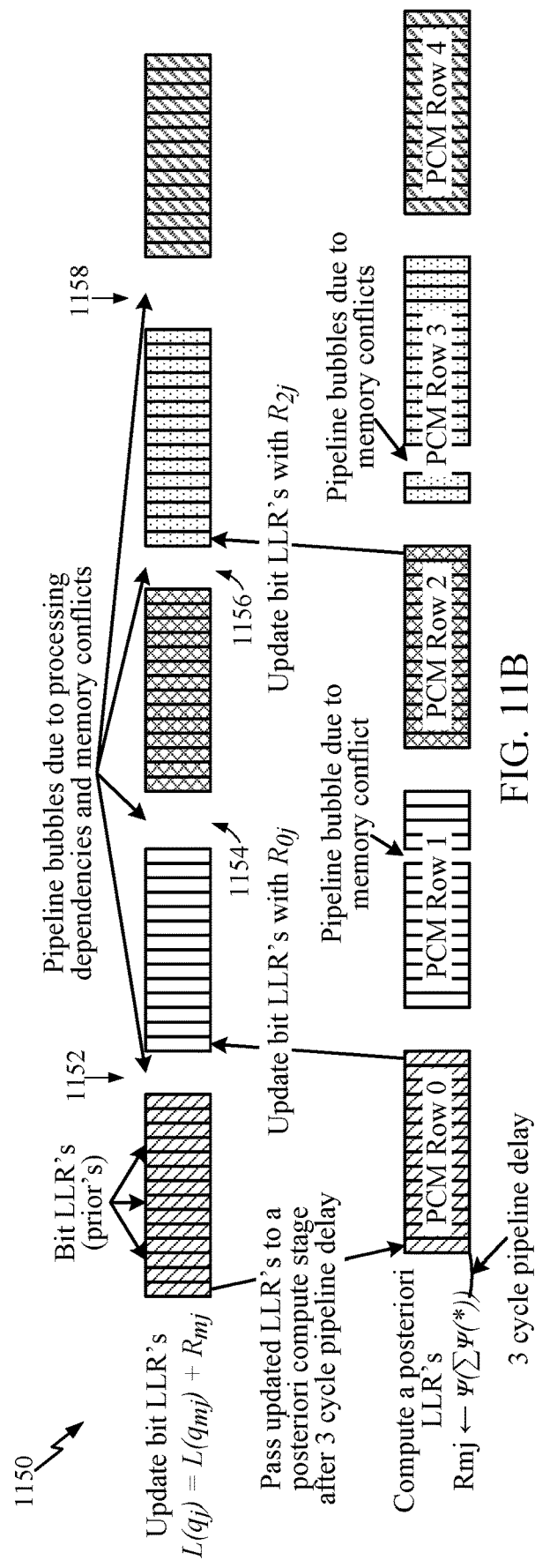

For example, FIG. 11A illustrates an example processing pipeline 1100 showing this row-by-row processing for computing a posteriori LLRs and updating the bit LLRs based on the a posteriori LLRs. As illustrated in FIG. 11A, pipeline delays (e.g., gaps in the processing) 1102, 1104, 1106, and 1108 are present due to recursive processing with an interdependency between the a posteriori computation (e.g., Equations 6-9) and the bit LLR update steps (e.g., Equation 10). The pipeline delays grow with increasing pipeline depth as well as memory conflicts, for example, as illustrated in example processing pipeline 1150, shown FIG. 11B, where it can be seen that an increase in pipeline depth to 3 cycles along with memory conflicts increases the number of processing cycles wasted due to pipeline delays 1152, 1154, 1156, and 1158. Thus, aspects of the present disclosure present techniques for mitigating pipeline delays in LDPC decoding, for example, by using a parity check matrix with full or quasi row-orthogonality, as described below in greater detail.

Row Orthogonality in LDPC Rate Compatible Design

Layered LDPC decoders often have delays in update processes, for example, as described above. For example, in a check layered decoder, updates to variable node sums (e.g., a posteriori computation described above, for example, using Equations 6-9) occur after the completion of a check layer update (e.g., the bit LLR update steps described above, for example, using Equation 10) and the incorporation of these updates might be further delayed by additional processing steps and memory accesses. If the edge connectivity of the base LDPC code is such that variable nodes are connected to two consecutive layers, then there is potential for a negative impact to decoder performance. When the second such layer is processed, the updated variable node sum may not yet be available, so the potential gain from the previous layer processing is not available to, and does not benefit the performance of, that layer. In some cases, this lack of updated variable node sums may be circumvented by introducing additional delay. However, this additional delay may result in a slowing down of the decoder and potentially degrade performance through a reduction in total available iterations.

In some cases, the subsequent layers of an LDPC code can be constrained to be 'orthogonal', meaning that subsequent layers have no base variable nodes in common. Such a constraint can, however, degrade performance through the implied constraint on base graph structure, which limits the connectivity of the graph.

LDPC designs for 5G NR typically are rate compatible and have a high-rate core graph consisting of a first few layers (e.g., approximately 6 layers or rows) of the construction followed by hybrid automatic repeat request (HARQ) bit layers that are used to lower the rate of the code, for example, as illustrated in FIGS. 12 and 12A through 12H.

Figure 12:
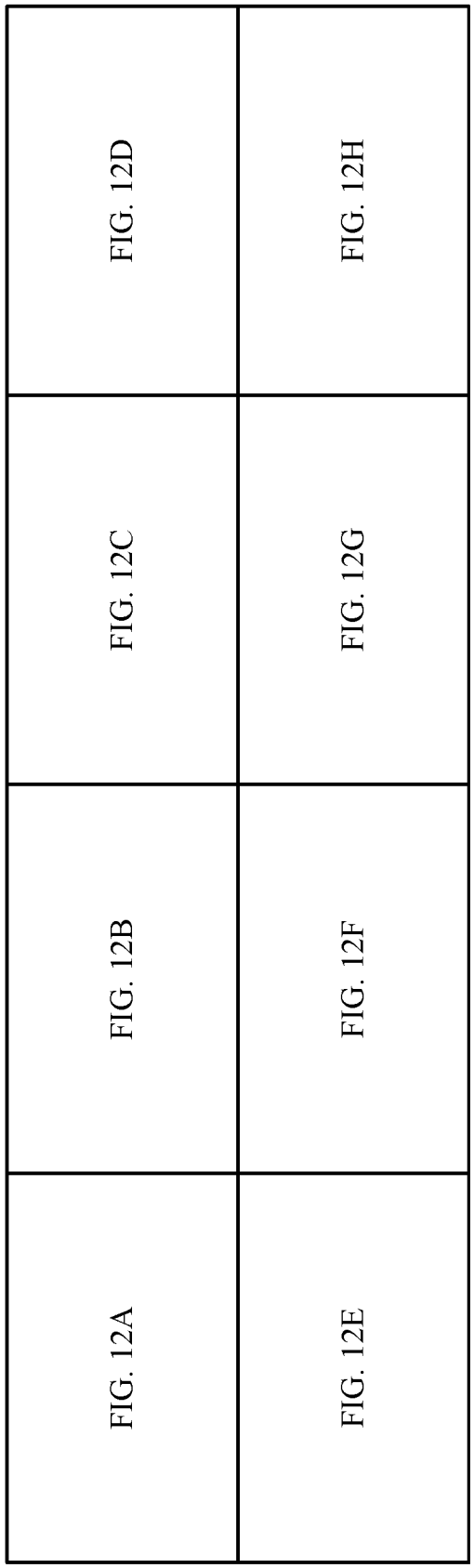
Figure 12B:
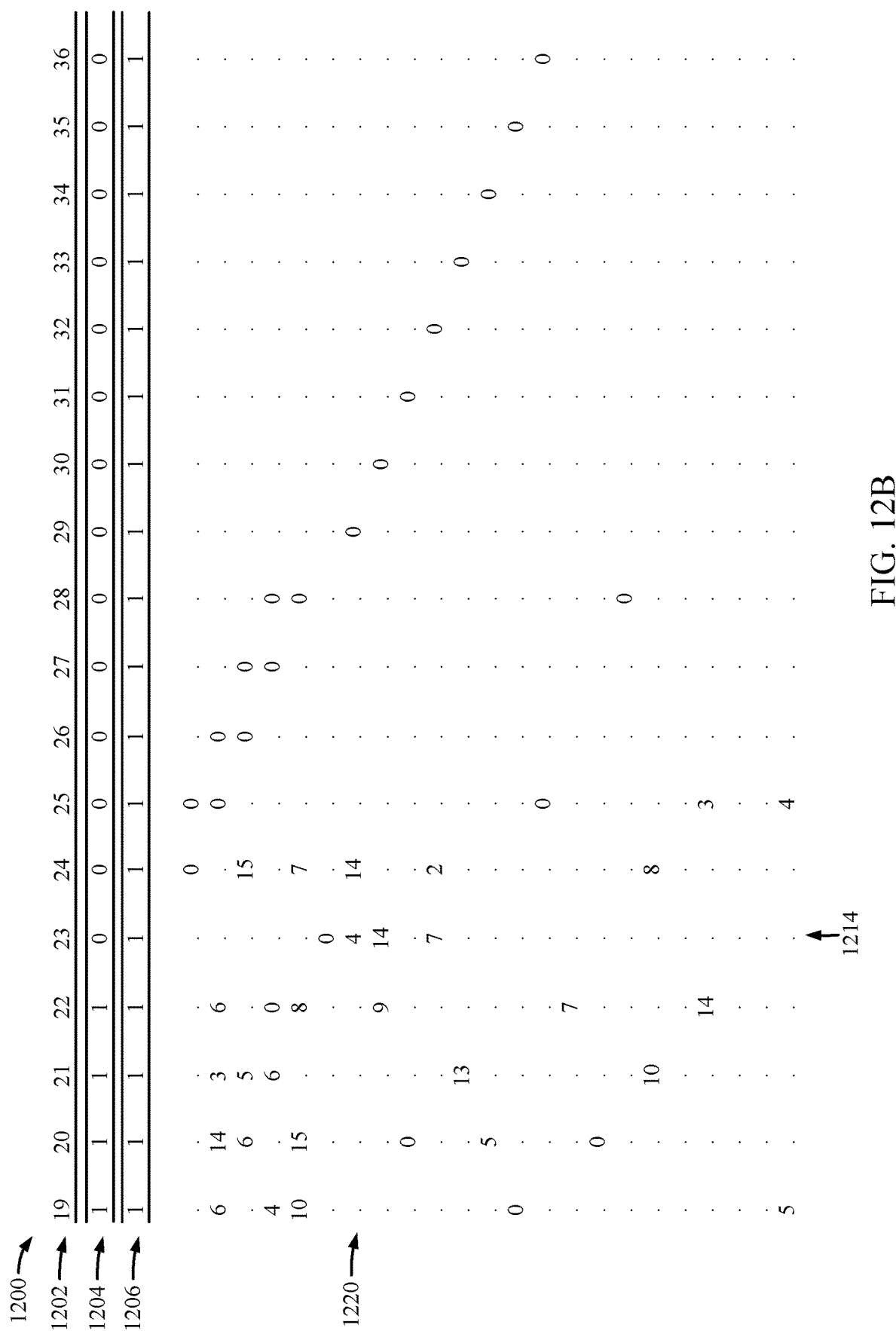
Figure 12C:
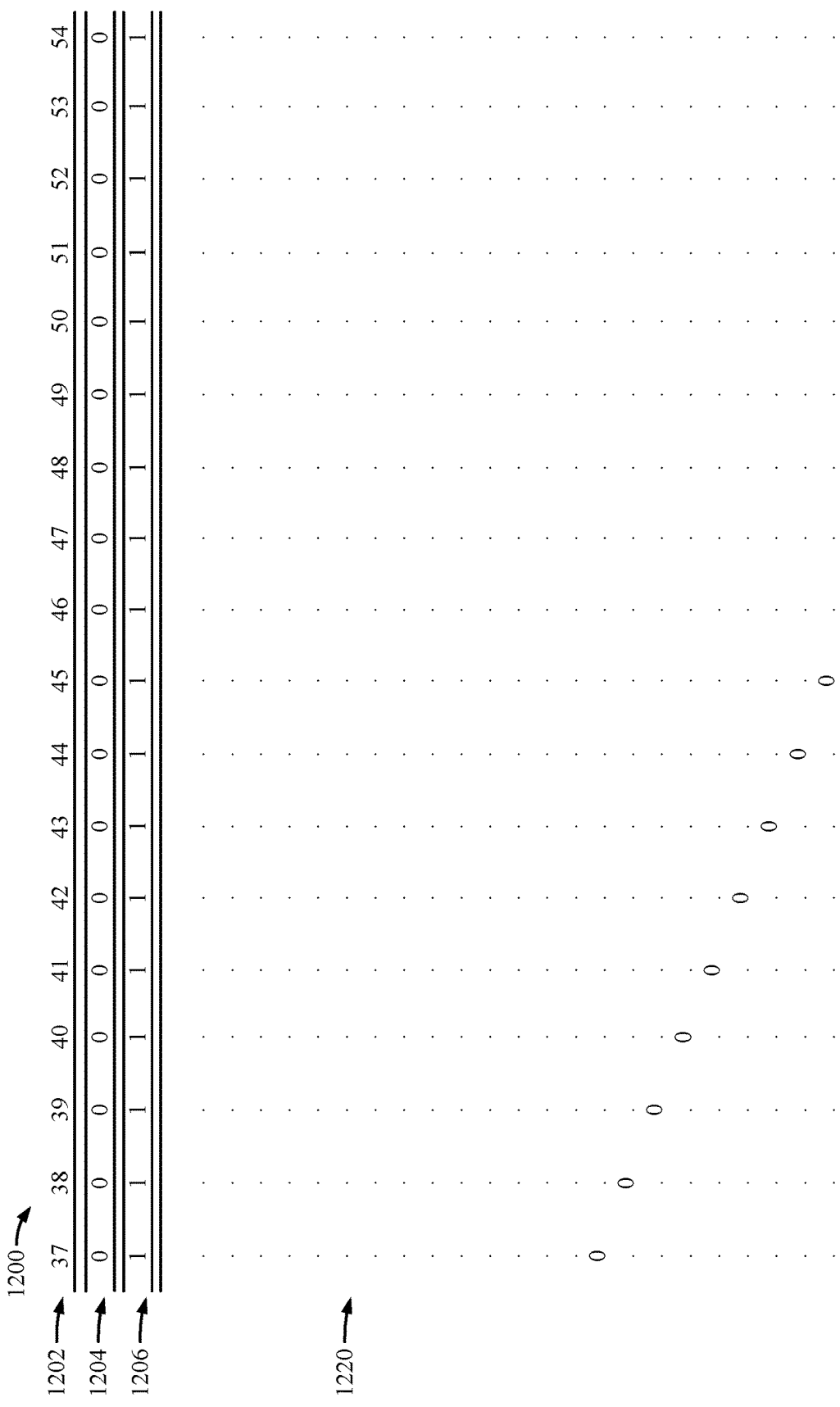
Figure 12D:
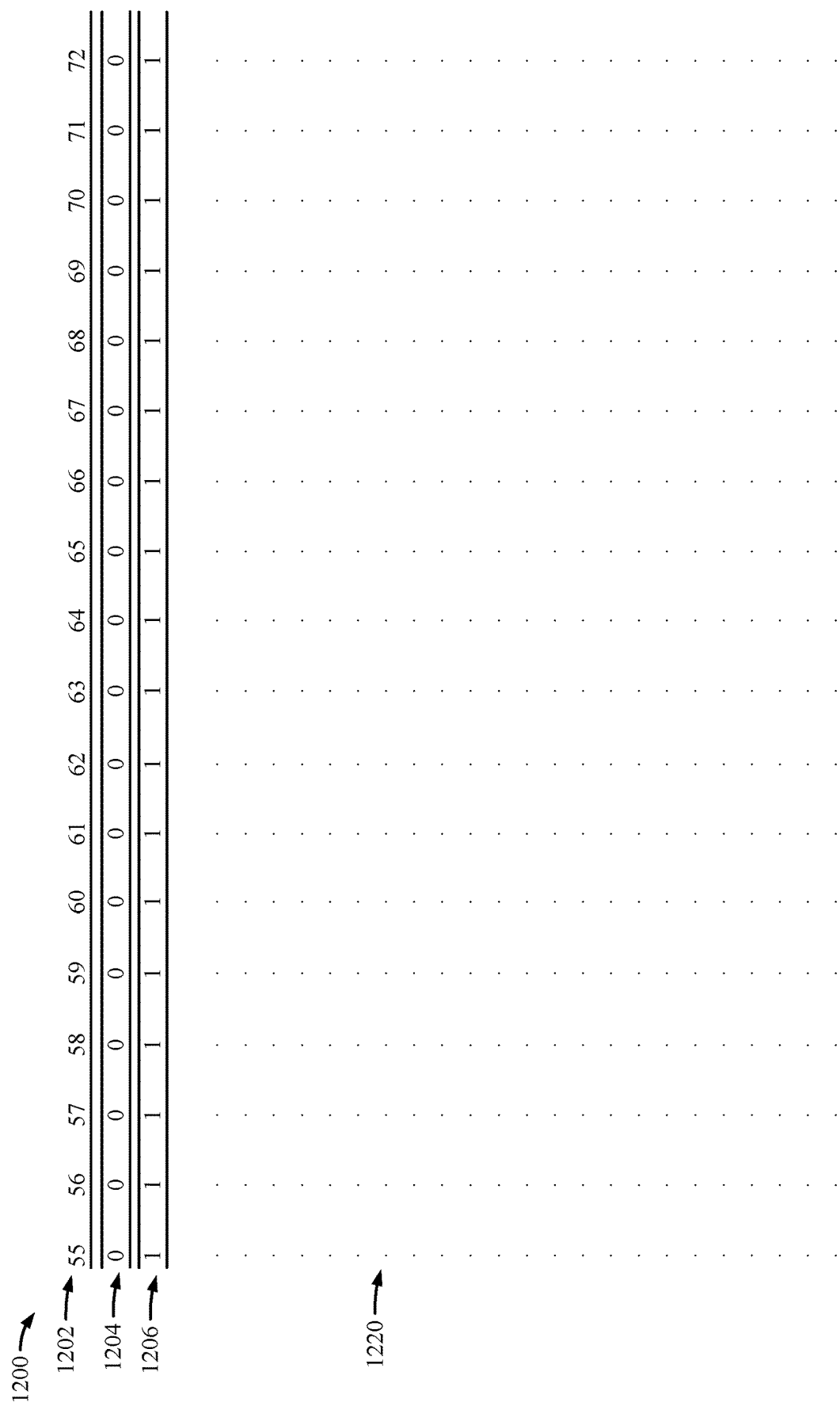
Figure 12E:
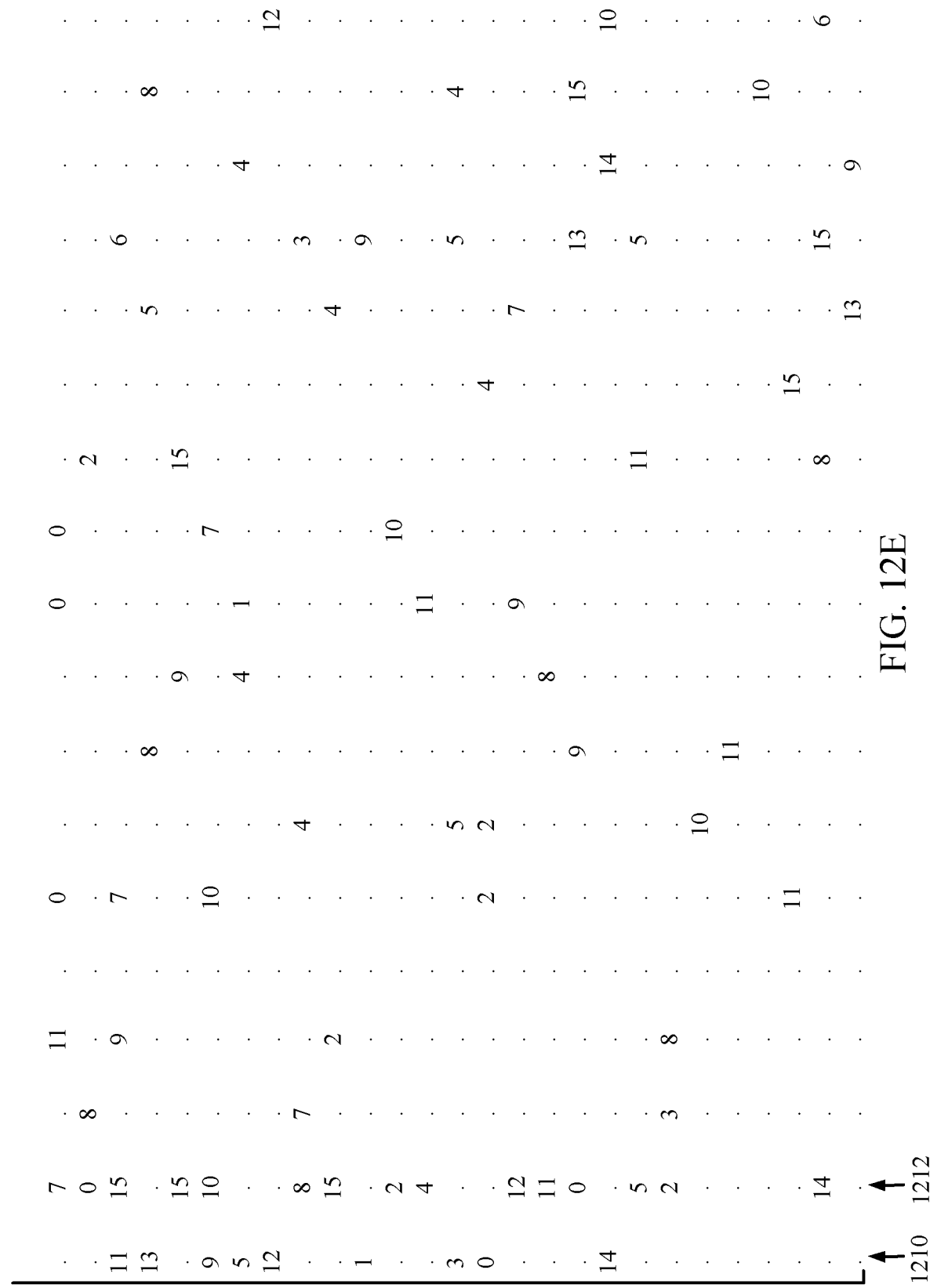
Figure 12F:
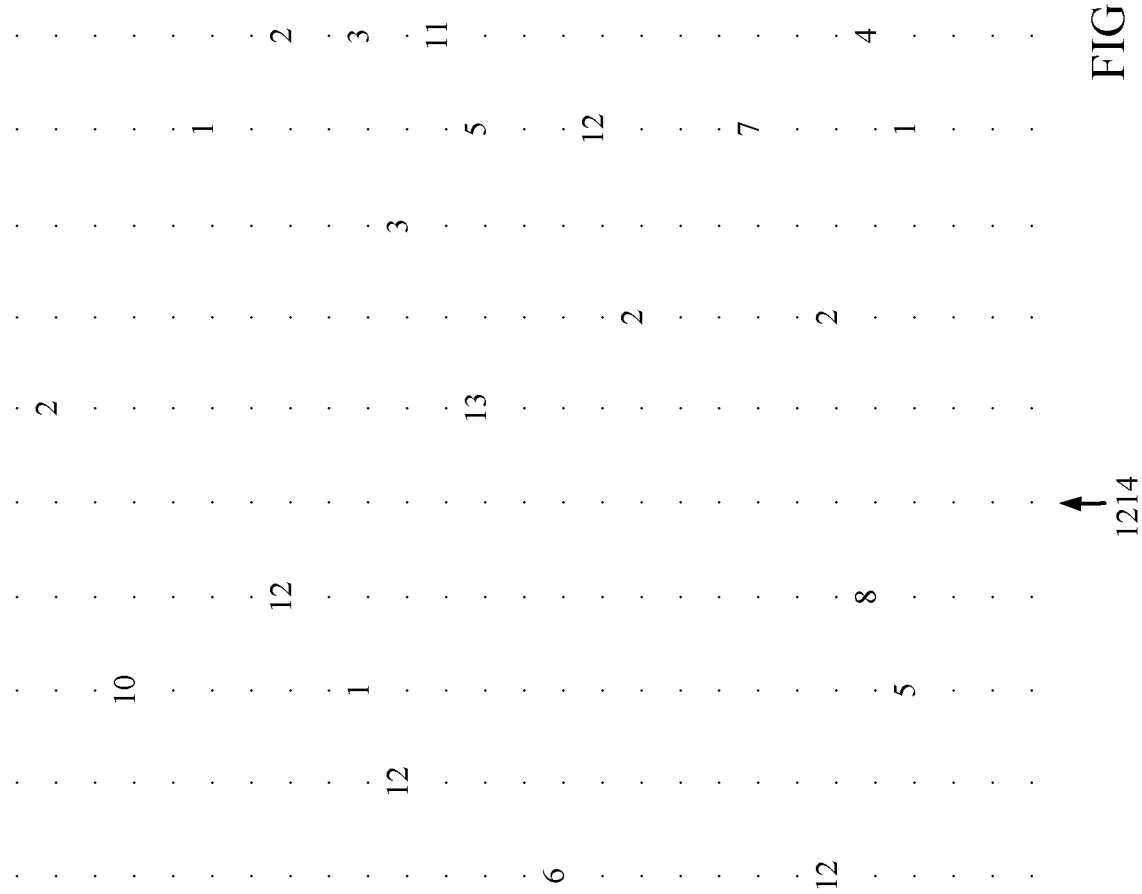
Figure 12G:
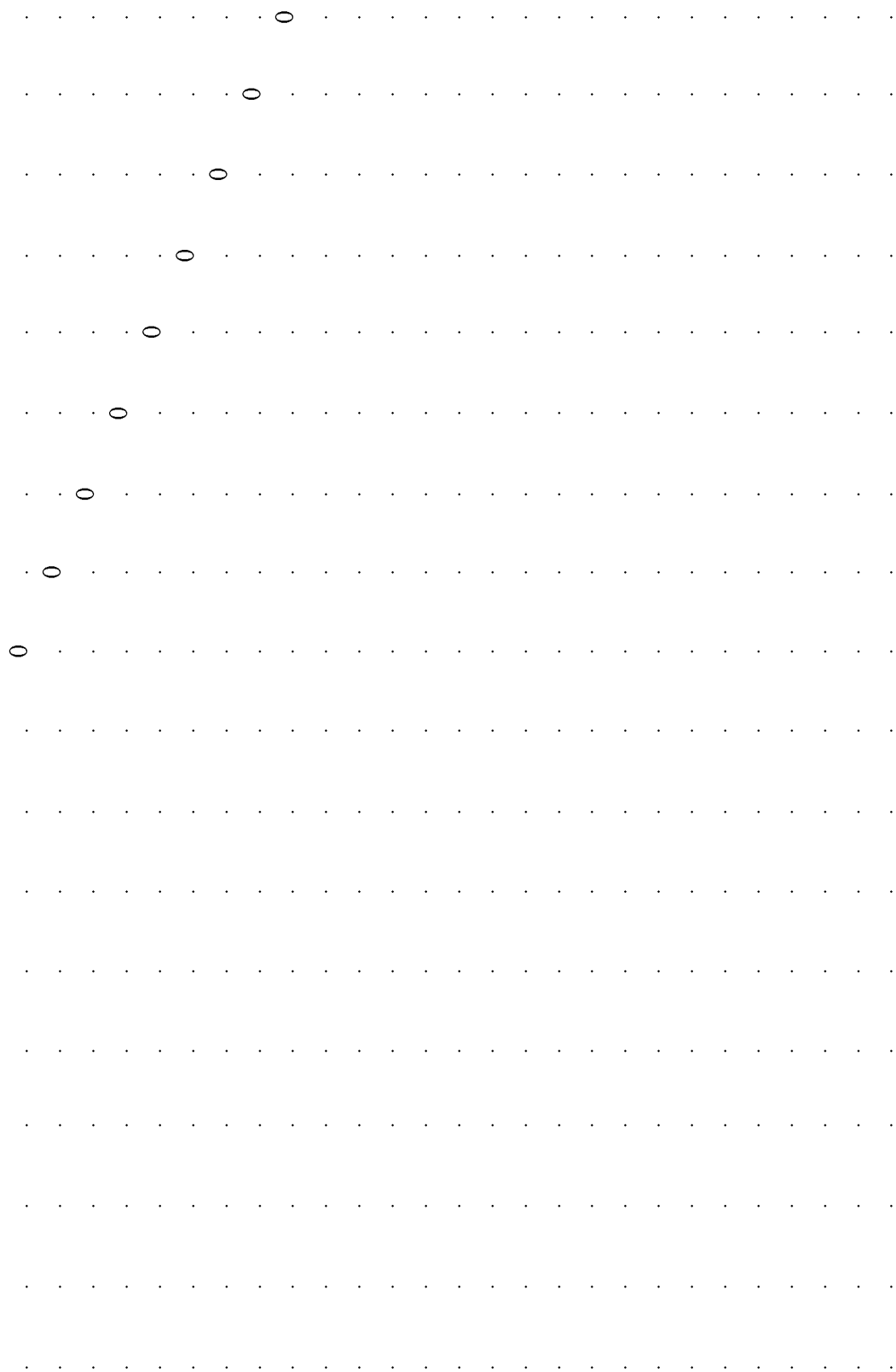
Figure 12H:
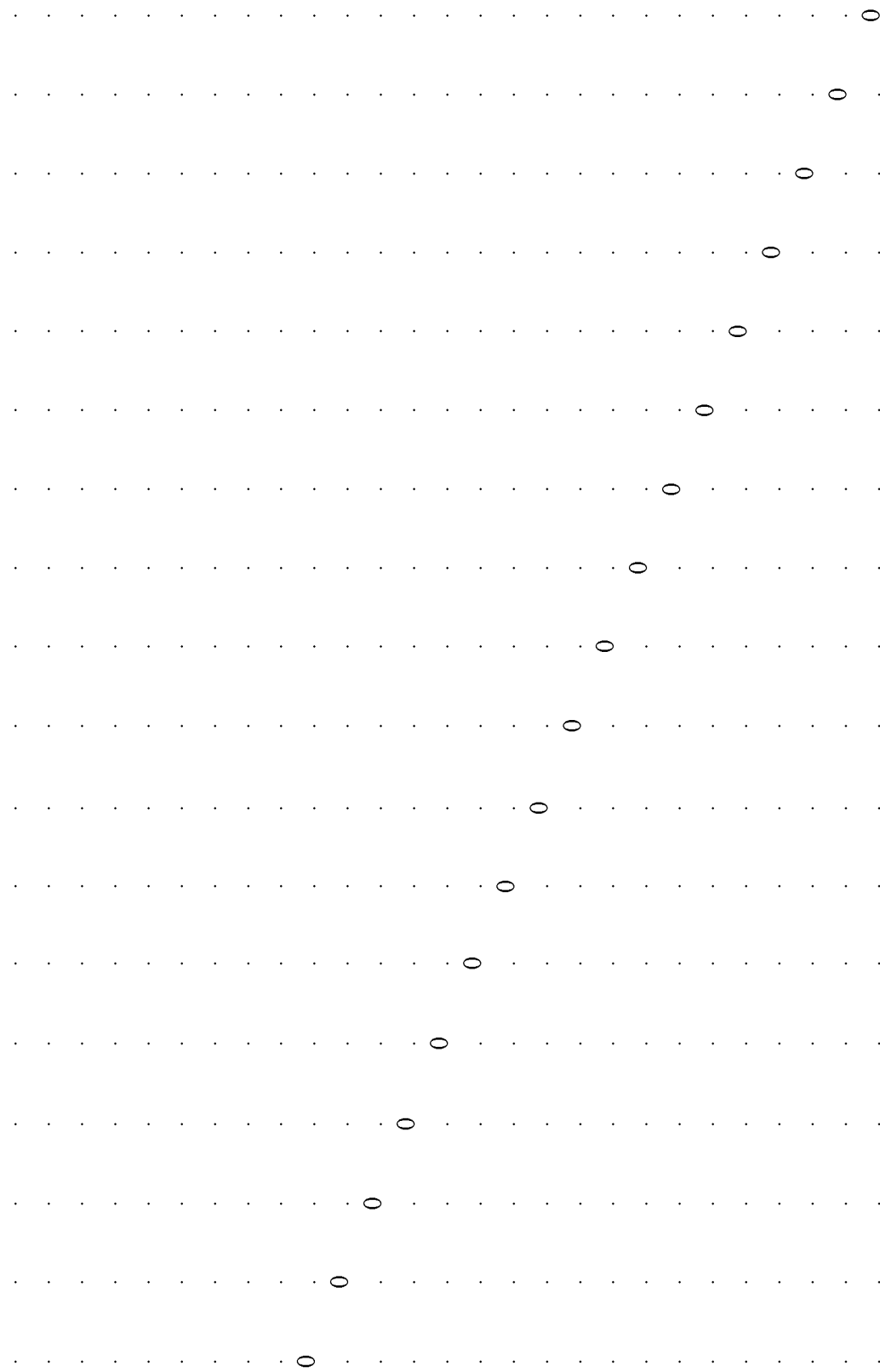

Note that FIGS. 12A through 12H represent a parity check matrix when arranged as illustrated in FIG. 12. That is, FIGS. 12A through 12D shows rows 1-23 of a parity check matrix, and FIGS. 12E through 12H shows rows 24-50 of the same parity check matrix.

In some cases, it may not be feasible to ensure orthogonality in the core graph. In recent LDPC designs for 5G NR, the base graphs have often included two relatively high degree punctured variable nodes (e.g., columns 1 and 2) that are punctured, as illustrated in columns 1210 and 1212 in the matrix 1200 in FIGS. 12A and 12E. Optimization of the connectivity of the graph usually results in high connectivity (many edges) for those nodes, especially, in the first HARQ parity layers that are designed for use in relatively high rate transmissions. This has led to the notion of 'quasi-orthogonality,' which means that subsequent layers (e.g., subsequent to the core base graph layers) are orthogonal except on the high degree punctured nodes (and possibly the core parity bit formed from these two nodes), which may be repeatedly connected across subsequent layers. Most decoder implementations will then absorb the degradation due to delayed updates for the high degree punctured variable nodes.

According to aspects of the present disclosure, FIGS. 12A-12H illustrate an example of a lifted parity check matrix 1200 that is quasi-row orthogonal. For example, each row may represent a layer, except for the first three demarked rows 1202, 1204, and 1206 (see FIGS. 12A-12D), which represent labels. The first (top) row 1202 contains labels that enumerate the columns of the matrix. The second row 1204 contains labels that are encoding indicators, where a 1 indicates a systematic (information) column and a 0 indicates a parity column. The third row 1206 contains labels that are transmission indicators, where a 0 indicates puncturing (i.e., no transmission) and a 1 indicates transmission.

According to aspects of the present disclosure, the first two columns 1210 and 1212 (see FIGS. 12A and 12E) of the parity check matrix illustrated in FIGS. 12A-12H represent high degree punctured variable nodes, and column 23, labeled 1214 (see FIGS. 12B and 12F), represents a special parity bit formed from the two punctured columns. The core portion of the graph consists of the first 6 rows (layers) and the HARQ rows start from the seventh row, labeled 1220 (see FIGS. 12A-12D), down. Note that from the seventh row down no column has a non-empty entry in two consecutive rows other than columns 1, 2, and 23, labeled 1210, 1212, and 1214. Thus, the parity check matrix illustrated in FIGS. 12 and 12A-12H is quasi-row orthogonal.

As HARQ layers are added and the corresponding transmission rate lowers, the connectivity of these nodes can be relaxed. Often, beyond a certain point as layers increase and target code rate decreases, the density of the connectivity of the punctured nodes decreases. In particular, at most one of the punctured nodes will typically be connected to each layer. If, in addition, the design has nearly balanced connectivity of the two punctured nodes, meaning that they each connect to approximately the same number of layers, then it is possible to achieve full orthogonality for those layers, for example, as illustrated in FIGS. 13 and 13A through 13H.

Figure 13:
Figure 13A:
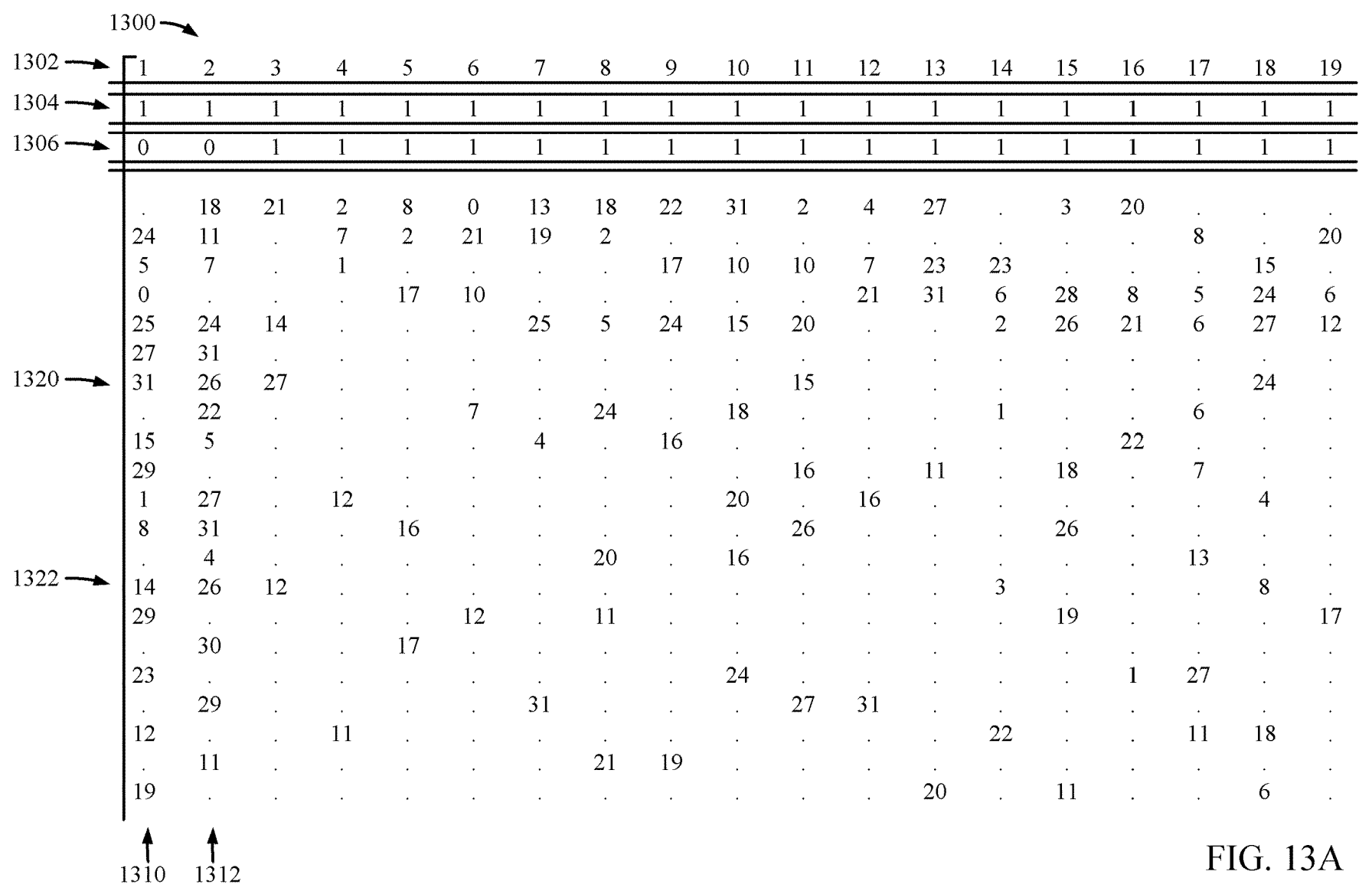
Figure 13C:
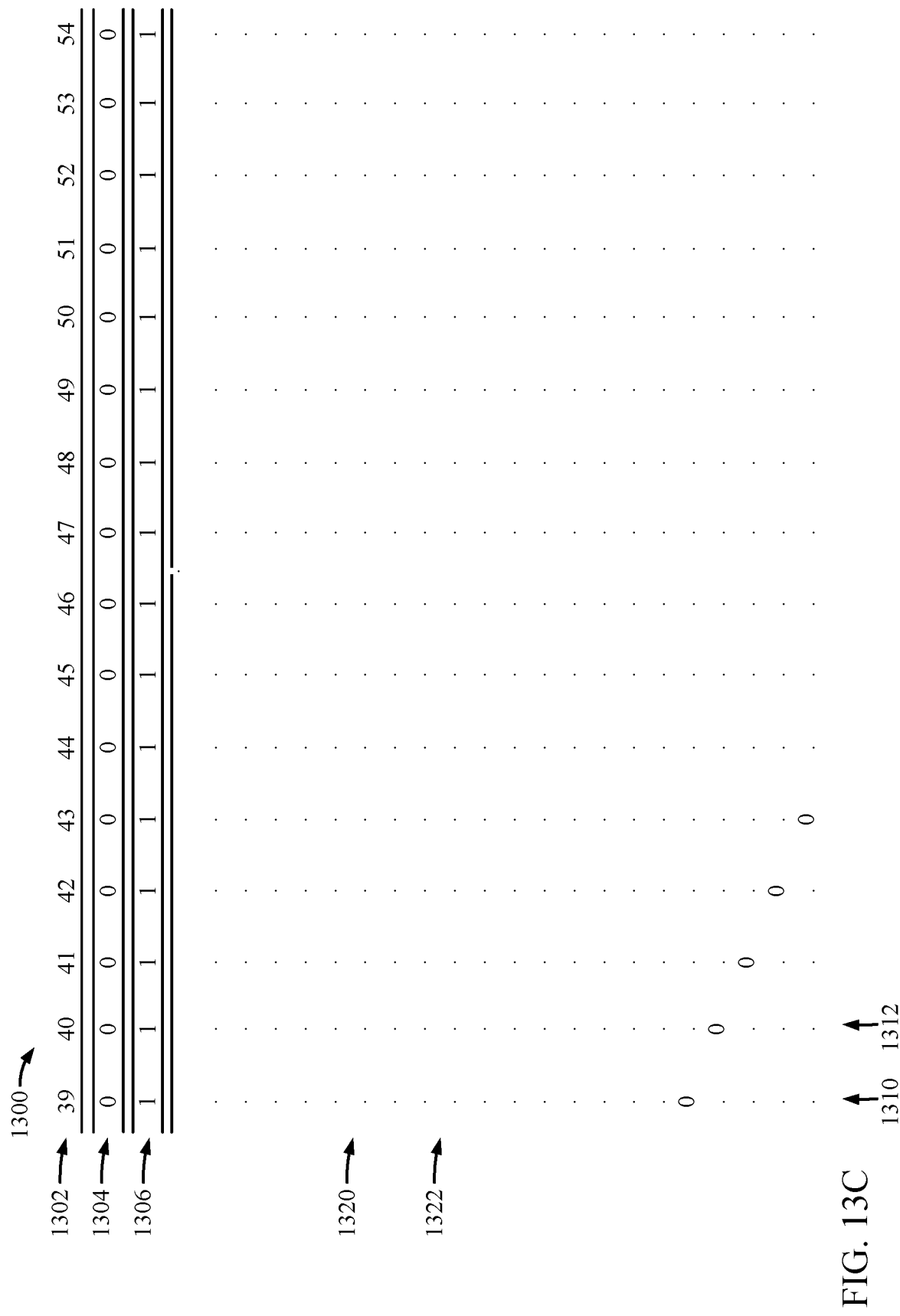
Figure 13D:
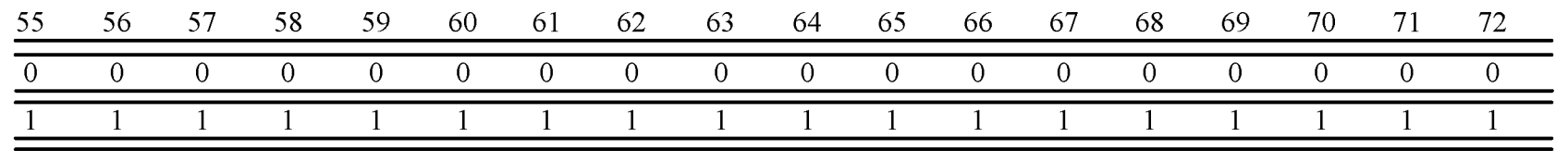
Figure 13E:
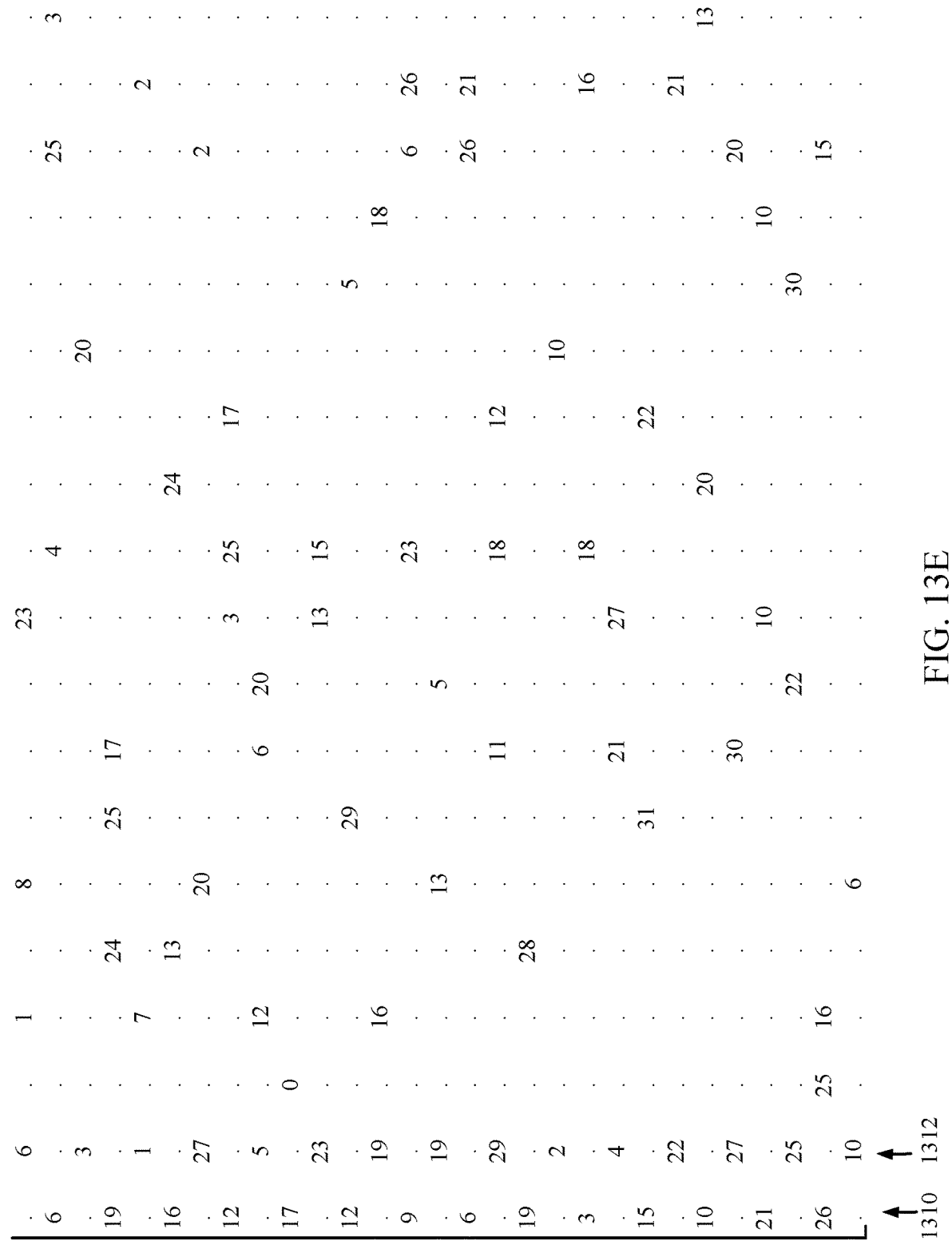
Figure 13F:
Figure 13G:
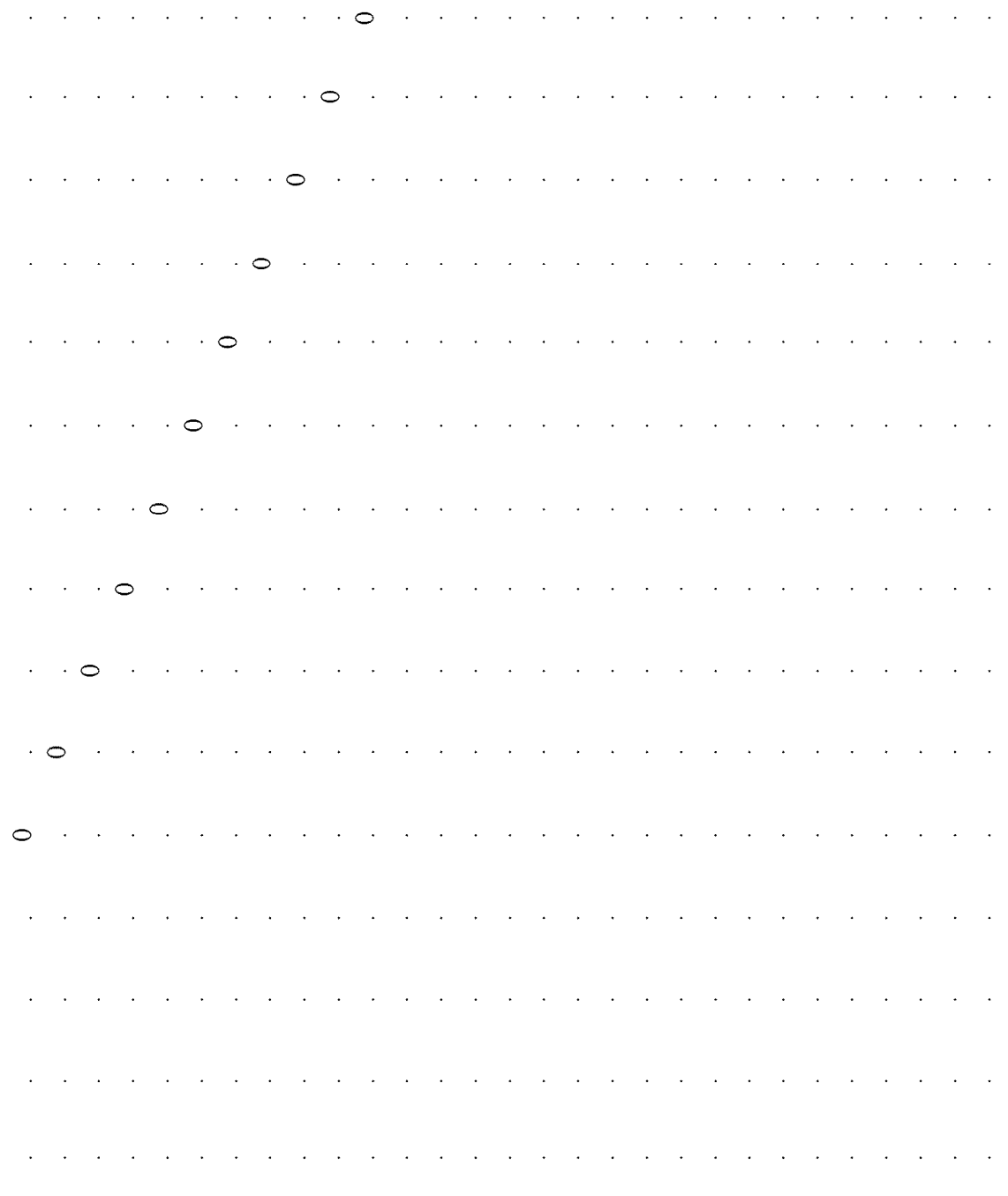
Figure 13H:
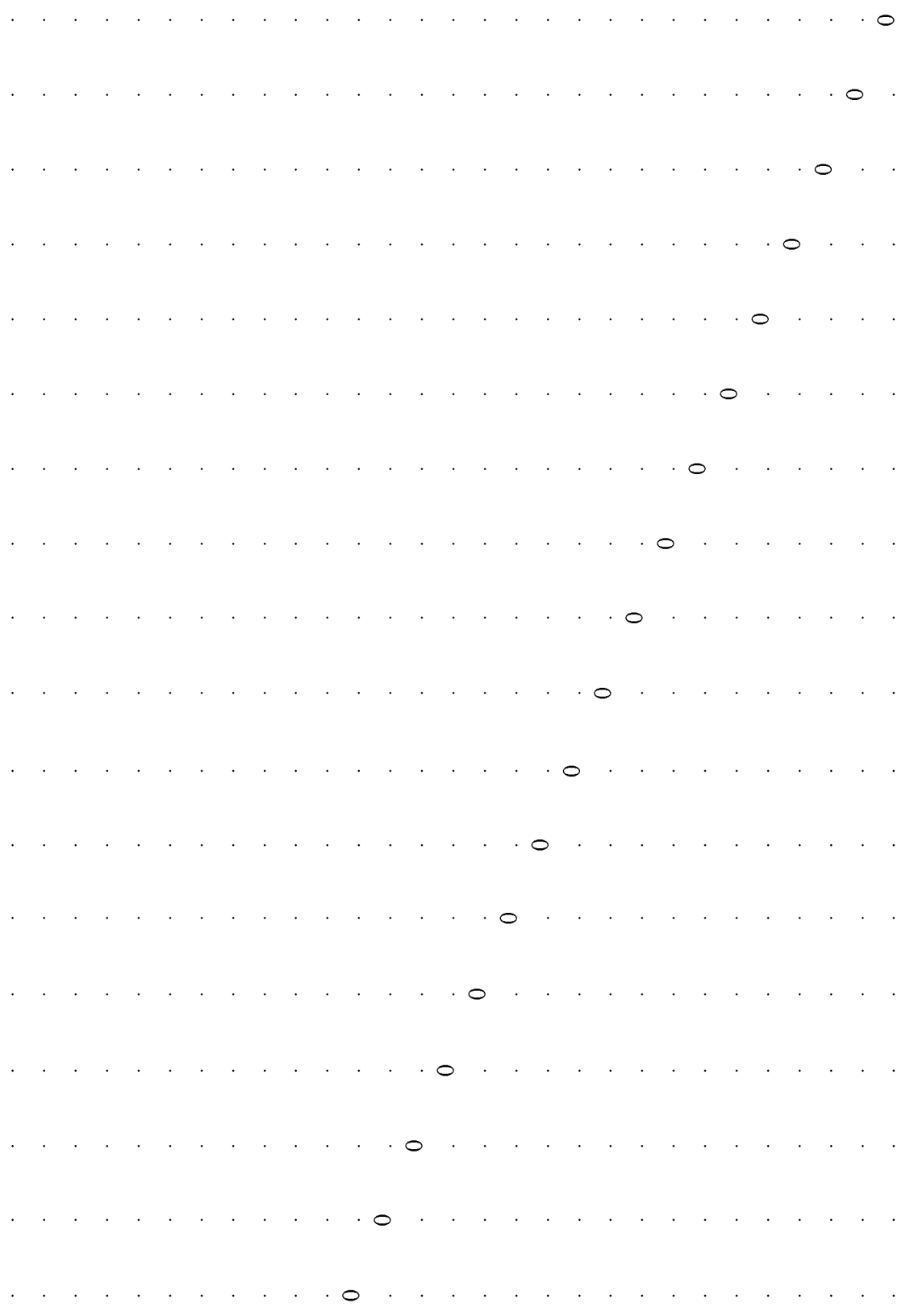

As noted above, FIGS. 13A-13H illustrate, when arranged as shown in FIG. 13, a similar parity check matrix 1300 as the parity check matrix 1200 illustrated in FIGS. 12A-12H, except that the parity check matrix 1300 is fully pairwise row-orthogonal after the 14th row/layer 1322 (see FIGS. 13A-13D). For example, as illustrated, row/layer 14 is the last layer where both punctured variable nodes (columns 1 and 2, labeled 1310 and 1312) are connected. All subsequent rows (layers) are pairwise fully orthogonal. For example, as illustrated, no two consecutive rows after row 14, labeled 1322, have an entry in the matrix in the same column, thus making the rows after row 14 fully pairwise orthogonal with each other. Note that the high degree punctured variable nodes are connected in an alternating fashion, thus allowing the rows to be fully orthogonal.

According to aspects of the present disclosure, using the parity check matrix illustrated in FIGS. 13A-13H increases decoder performance, for example, by allowing for the most up-to-date variable check sums to be used in the process of decoding a row of the parity check matrix. For example, since no variable nodes are connected to two consecutive layers, the decoder has time to compute the updated variable check sums before the updated variable check sums are needed for processing another row.

Thus, aspects of the present disclosure propose techniques for increasing the availability of the updated variable node sums used during decoding without the performance degradation associated with adding additional delays during the decoding process (discussed above), for example, by maintaining full-layer orthogonality for all layers below the last layer in which the two punctured base variable nodes are both connected to the same layer. Such a constraint (e.g., full row orthogonality) may result in an alternating structure where the two punctured nodes alternate connectivity to subsequent layers, for example, as illustrated in FIGS. 13 and 13A-13H (note, FIGS. 13A-13H illustrate one parity check matrix 1300, with FIGS. 13A-13D illustrating rows 1-21 of the parity check matrix 1300 and FIGS. 13E-13H illustrating rows 22-50 of the parity check matrix 1300), and can result in orthogonality of approximately ⅔ (e.g., more than ½) of all layers.

Figure 14:
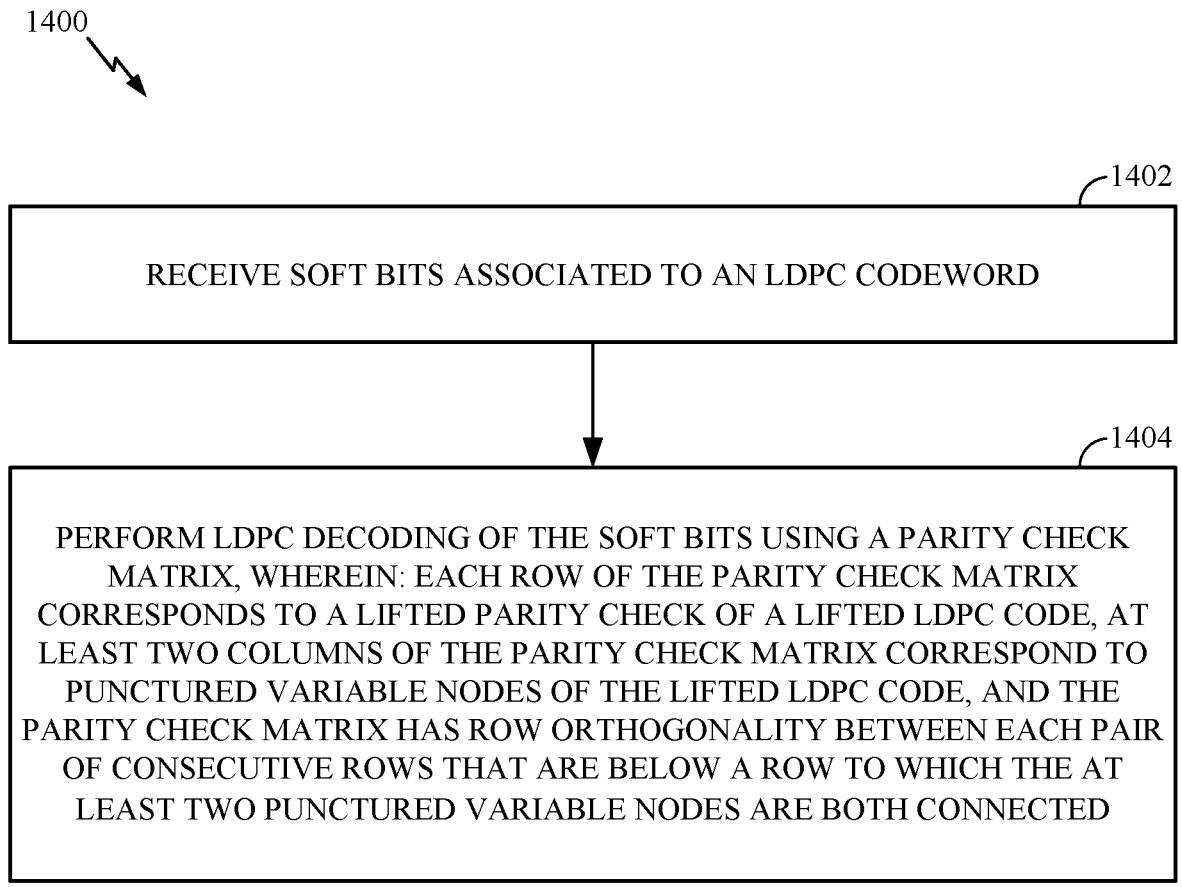
FIG. 14 is a flow diagram illustrating example operations for decoding low-density parity check (LDPC) codes, according to certain aspects of the present disclosure.

FIG. 14 illustrates example operations 1400 for wireless communications, for example, for reducing processing delays when decoding LDPC encoded bits. According to certain aspects, operations 1400 may be performed by a wireless communications device (e.g., by a receiver and a decoder (e.g., decoder 812) in the wireless communications device), such as a base station (e.g., Node B 110 and/or base station 210), a user equipment (e.g., UE 116 and/or UE 250), and/or wireless device 302.

Operations 1400 begin at block 1402 by the wireless communications device receiving soft bits associated to an LDPC codeword. For example, UE 116 (e.g., a receiver of UE 116) receives soft bits associated to an LDPC codeword from base station 102.

At 1404, the wireless communications device performs LDPC decoding of the soft bits using a parity check matrix, wherein: each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected. Continuing the example from above, UE 116 (e.g., a decoder of UE 116) performs LDPC decoding of the soft bits (i.e., the soft bits received in block 1402) using a parity check matrix (e.g., the parity check matrix 1300 illustrated in FIGS. 13 and 13A-13H), wherein each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected.

Figure 15:
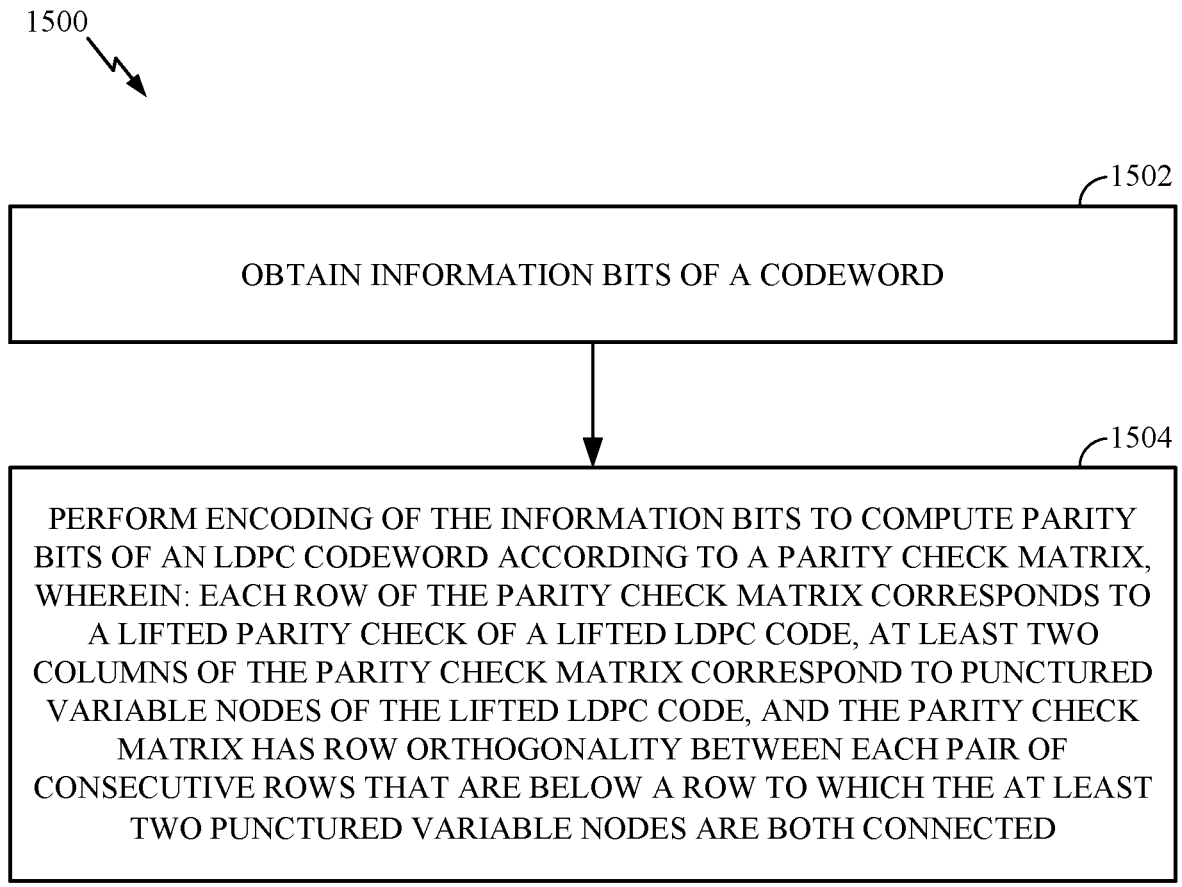
FIG. 15 is a flow diagram illustrating example operations for performing low-density parity check (LDPC) encoding, according to certain aspects of the present disclosure.

FIG. 15 illustrates example operations 1400 for wireless communications, for example, for performing LDPC encoding. According to certain aspects, operations 1500 may be performed by a wireless communications device (e.g., by a transmitter and an encoder (e.g., encoder 706) in the wireless communications device), such as a base station (e.g., Node B 110 and/or base station 210), a user equipment (e.g., UE 116 and/or UE 250), and/or wireless device 302.

Operations 1500 begin at block 1502 by the wireless communications device obtaining information bits of a codeword. For example, UE 116 (e.g., an encoder of UE 116) obtains information bits of a codeword (e.g., from an application running on the UE).

At 1504, the wireless communications device performs encoding of the information bits to compute parity bits of an LDPC codeword according to a parity check matrix, wherein: each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected. Continuing the example from above, UE 116 (e.g., an encoder of UE 116) performs encoding of the information bits (i.e., the information bits obtained in block 1502) according to a parity check matrix (e.g., the parity check matrix 1300 illustrated in FIGS. 13 and 13A-13H), wherein each row of the parity check matrix corresponds to a lifted parity check of a lifted LDPC code, at least two columns of the parity check matrix correspond to punctured variable nodes of the lifted LDPC code, and the parity check matrix has row orthogonality between each pair of consecutive rows that are below a row to which the at least two punctured variable nodes are both connected.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for computing, means for determining, means for utilizing, means for updating, means for reading, means for performing, and/or means for selecting may comprise a processing system including one or more processors, such as processor 230 and/or RX Data Processor 242 of the base station 210 and/or the processor 270 and/or RX Data Processor 260 of the user terminal 250. Additionally, means for storing may comprise a memory, such as the memory 232 of the base station 210 and/or the memory 272 of the user terminal 250. Further, means for receiving may comprise a receiver and/or antenna, such as the receiver 222 and/or antenna 224 of the base station 210 and/or the receiver 254 and/or antenna 252 of the user terminal 250.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a wireless node (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a wireless node and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a wireless node and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method for performing low-density parity-check (LDPC) decoding, the method comprising:
receiving soft bits associated to an LDPC codeword; and
performing LDPC decoding of the soft bits using a parity check matrix generated from a base graph, wherein:
each row of the base graph corresponds to a lifted parity check of a lifted LDPC code;
at least two columns of the base graph correspond to punctured variable nodes of the lifted LDPC code; and
the base graph has row orthogonality between each pair of consecutive rows that are below a lowest row to which the at least two punctured variable nodes are both connected, wherein for each row below the lowest row to which the at least two punctured variable nodes are both connected, no column has a non-empty entry in two consecutive rows.

2. The method of claim 1, wherein in each pair of consecutive rows the two punctured variable nodes alternate connections to subsequent rows.

3. The method of claim 1, wherein at least ½ of all pairs of consecutive rows of the base graph have row orthogonality.

4. The method of claim 3, wherein:
the at least ½ of all pairs of consecutive rows comprises the last ½ of all rows of the base graph;
the base graph comprises:
a first set of N consecutive rows; and
a second set of consecutive rows positioned below the first set of N consecutive rows in the base graph; and
the last ½ of all rows of the base graph correspond to the second set of consecutive rows.

5. The method of claim 1, wherein in each pair of consecutive rows below the lowest row to which the at least two punctured variable nodes are both connected, the two punctured variable nodes alternate connections to subsequent rows.

6. An apparatus for wireless communications, comprising:
a processor configured to:
cause the apparatus to receive soft bits associated to a low-density parity-check (LDPC) codeword; and
perform LDPC decoding of the soft bits using a parity check matrix generated from a base graph, wherein:
each row of the base graph corresponds to a lifted parity check of a lifted LDPC code;
at least two columns of the base graph correspond to punctured variable nodes of the lifted LDPC code; and
the base graph has row orthogonality between each pair of consecutive rows that are below a lowest row to which the at least two punctured variable nodes are both connected, wherein for each row below the lowest row to which the at least two punctured variable nodes are both connected, no column has a non-empty entry in two consecutive rows; and
a memory coupled with the processor.

7. The apparatus of claim 6, wherein in each pair of consecutive rows the two punctured variable nodes alternate connections to subsequent rows.

8. The apparatus of claim 6, wherein at least ½ of all pairs of consecutive rows of the base graph have row orthogonality.

9. The apparatus of claim 8, wherein:
the at least ½ of all pairs of consecutive rows comprises the last ½ of all rows of the base graph;
the base graph comprises:
a first set of N consecutive rows; and
a second set of consecutive rows positioned below the first set of N consecutive rows in the base graph; and
the last ½ of all rows of the base graph correspond to the second set of consecutive rows.

10. The apparatus of claim 6, wherein in each pair of consecutive rows below the lowest row to which the at least two punctured variable nodes are both connected, the two punctured variable nodes alternate connections to subsequent rows.

11. A method for performing low-density parity-check (LDPC) encoding, the method comprising:
obtaining information bits of a codeword; and
performing encoding of the information bits to compute parity bits of an LDPC codeword according to a parity check matrix generated from a base graph, wherein:
each row of the base graph corresponds to a lifted parity check of a lifted LDPC code,
at least two columns of the base graph correspond to punctured variable nodes of the lifted LDPC code, and
the base graph has row orthogonality between each pair of consecutive rows that are below a lowest row to which the at least two punctured variable nodes are both connected, wherein for each row below the lowest row to which the at least two punctured variable nodes are both connected, no column has a non-empty entry in two consecutive rows.

12. The method of claim 11, wherein in each pair of consecutive rows the two punctured variable nodes alternate connections to subsequent rows.

13. The method of claim 11, wherein at least ½ of all pairs of consecutive rows of the base graph have row orthogonality.

14. The method of claim 13, wherein:
the at least ½ of all pairs of consecutive rows comprises the last ½ of all rows of the base graph;
the base graph comprises:
a first set of N consecutive rows; and
a second set of consecutive rows positioned below the first set of N consecutive rows in the base graph; and
the last ½ of all rows of the base graph correspond to the second set of consecutive rows.

15. The method of claim 11, wherein in each pair of consecutive rows below the lowest row to which the at least two punctured variable nodes are both connected, the two punctured variable nodes alternate connections to subsequent rows.

16. An apparatus for wireless communications, comprising:
a processor configured to:
obtain information bits of a codeword; and
perform encoding of the information bits to compute parity bits of an LDPC codeword according to a parity check matrix generated from a base graph, wherein:
each row of the base graph corresponds to a lifted parity check of a lifted LDPC code,
at least two columns of the base graph correspond to punctured variable nodes of the lifted LDPC code, and
the base graph has row orthogonality between each pair of consecutive rows that are below a lowest row to which the at least two punctured variable nodes are both connected, wherein for each row below the lowest row to which the at least two punctured variable nodes are both connected, no column has a non-empty entry in two consecutive rows; and
a memory coupled with the processor.

17. The apparatus of claim 16, wherein in each pair of consecutive rows the two punctured variable nodes alternate connections to subsequent rows.

18. The apparatus of claim 16, wherein at least ½ of all pairs of consecutive rows of the base graph have row orthogonality.

19. The apparatus of claim 18, wherein:
the at least ½ of all pairs of consecutive rows comprises the last ½ of all rows of the base graph;
the base graph comprises:
a first set of N consecutive rows; and
a second set of consecutive rows positioned below the first set of N consecutive rows in the base graph; and
the last ½ of all rows of the base graph correspond to the second set of consecutive rows.

20. The apparatus of claim 16, wherein in each pair of consecutive rows below the lowest row to which the at least two punctured variable nodes are both connected, the two punctured variable nodes alternate connections to subsequent rows.

* * * * *